(12) United States Patent  
Mathew et al.

(10) Patent No.: US 8,094,641 B2
(45) Date of Patent: Jan. 10, 2012

(54) TD-SCDMA UPLINK PROCESSING

(75) Inventors: Deepak Mathew, Wilmington, MA (US); Russ Mestechkin, Winchester, MA (US); Prahallada Ponnathota, Woburn, MA (US); Thomas F. Howe, Tyngsboro, MA (US); Timothy Perrin Fisher-Jeffes, Cambridge, MA (US)

(73) Assignee: MediaTek Inc., Hsin-Chu (TW)

( * ) Notice: Subject to any disclaimer, the term of this patent is extended or adjusted under 35 U.S.C. 154(b) by 756 days.

(21) Appl. No.: 12/194,516

(22) Filed: Aug. 19, 2008

(65) Prior Publication Data

US 2009/0161648 A1 Jun. 25, 2009

Related U.S. Application Data

(60) Provisional application No. 61/008,345, filed on Dec. 20, 2007.

(51) Int. Cl.
*H04B 7/216* (2006.01)

(52) U.S. Cl. .......................................... 370/345; 370/347

(58) Field of Classification Search .................. 370/375, 370/342, 347
See application file for complete search history.

(56) References Cited

U.S. PATENT DOCUMENTS

| 5,712,851 A | 1/1998 | Nguyen et al. ................ 370/399 |
| 2001/0034227 A1 | 10/2001 | Subramanian et al. ....... 455/419 |
| 2003/0207696 A1 | 11/2003 | Willenegger et al. ......... 455/522 |
| 2004/0014447 A1* | 1/2004 | Hepler et al. ................. 455/258 |
| 2004/0210684 A1* | 10/2004 | Granig et al. ................... 710/15 |
| 2006/0092825 A1 | 5/2006 | Kim et al. ...................... 370/206 |
| 2008/0080444 A1* | 4/2008 | Fisher-Jeffes et al. ......... 370/342 |

FOREIGN PATENT DOCUMENTS

| DE | 10311815 | 12/2004 |
| EP | 1550953 | 7/2005 |
| EP | 1755233 | 2/2007 |

OTHER PUBLICATIONS

"Communication Extended Search Report", European Application No. EP 08 17 2197.9, 7 pages, Apr. 1, 2011.
"Communication Extended Search Report", European Application No. EP 08 16 9999.3, 9 pages, Apr. 1, 2011.

(Continued)

*Primary Examiner* — Jung Park
(74) *Attorney, Agent, or Firm* — Fish & Richardson P.C.

(57) ABSTRACT

A wireless device has a BRP-CRP interface that includes a dual-port frame memory having a first access port and a second access port in which data can be written to the dual-port frame memory through the first access port at the same time that data is read from the dual-port frame memory through the second access port. A bit rate processor performs bit rate processing on input data and writes data resulting from the bit rate processing to the dual-port frame memory through the first access port. A chip rate processor reads data from the dual-port frame memory through the second access port and performs chip rate processing on the data read from the dual-port frame memory. A data processor executes a software application that writes data to the dual-port frame memory through the first access port and reads data from the dual-port frame memory through the second access port.

49 Claims, 14 Drawing Sheets

OTHER PUBLICATIONS

"3$^{rd}$ Generation Partnership Project; Technical Specification Group Radio Access Network; Multiplexing and channel coding (TDD) (Release 7)", 3GPP Standard; 3GPP TS 25.222, 3$^{rd}$ Generation Partnership Project (3GPP), Mobile Competence Centre; 650, Route Des Lucioles; F-06921 Sophia-Antipolis Cedex; France, No. V7.5.0, pp. 1-94, Nov. 1, 2007, XP050367042.

Miller et al., "High-Speed FIFOs Contend with Widely Differing Data Rates", Computer Design, Pennwell Publ. Littleton, Massachusetts, USA, vol. 24, No. 11, pp. 83-86, Sep. 1, 1985, XP000743270.

"Communication Extended Search Report", European Application No. EP 08169998.5, 7 pages, May 6, 2011.

* cited by examiner

TABLE 1

| Physical Channels | TrCH | | HW/SW Partitioning | Comments |
|---|---|---|---|---|
| DPCH 200 (Dedicated physical channel) | DCH | 1) Data Symbols 202 | BRP in HW CRP in HW | |
| | | 2) Control Symbols 204 (TFCI, TPC & SS) | BRP in SW CRP in HW | |
| P-RACH 208 (Physical random access channel) | RACH | 1) Random access signature 210 | SW | Random access signature (UpPTS) Handled by the SW. |
| | | 2) Random access channel data transmission 212 | BRP in HW CRP in HW | |
| PUSCH (Physical UL shared channel) | USCH | | Not supported | |
| PCPCH (Physical common packet channel) | CPCH | | Not supported | |
| UpPCH (Uplink pilot channel) | | | SW | |
| HS-SICH | | | BRP in SW CRP in HW | High speed shared information Control channel (Release 5: used for UL feedback signaling) |

TD-SCDMA UPLINK PROCESSING

RELATED APPLICATIONS

This application claims priority to U.S. Patent Application No. 61/008,345, titled "METHODS AND APPARATUS FOR TD-SCDMA UPLINK PROCESSING", filed on Dec. 20, 2007. This application is related to U.S. patent application Ser. No. 12/194,512, titled "TD-SCDMA UPLINK PROCESSING" and U.S. patent application Ser. No. 12/194,521, titled "TD-SCDMA UPLINK PROCESSING", both filed concurrently with this application. The contents of the above applications are incorporated herein by reference.

BACKGROUND

This description relates to TD-SCDMA uplink processing.

Time Division-Synchronous Code Division Multiple Access (TD-SCDMA) is a newly emerging third generation wireless standard widely expected to be deployed in China. TD-SCDMA is also part of 3rd Generation Partnership Project (3GPP) wireless standards. 3GPP is a global collaboration formed of numerous telecommunications associations whose mission is to assist in the creation and implementation of a 3G telecommunication system specification that is globally applicable, making TD-SCDMA an important standard for 3G applications.

TD-SCDMA is based on spread spectrum technology and combines aspects of both time division multiple access (TDMA) and code division multiple access (CDMA) concepts. One departure of TD-SCDMA from other 3G standards (e.g., Wideband Code Division Multiple Access (W-CDMA)) is the use of time division duplex (TDD) instead of frequency division duplex (FDD). Amongst other things, TDD separates outward and return signals to emulate full duplex communication over a half duplex communication link. TDD has a strong advantage over FDD in situations in which there is an asymmetry in the uplink and downlink data speed. Uplink refers to the data communications in a direction from the mobile device to the base station, whereas downlink refers to data communication in a direction from the base station to the mobile device.

In some communications, the uplink and downlink portions may have very different speed and bandwidth requirements. For example, when a mobile telephone downloads information from a network, downlink processing may require significantly more of the channel bandwidth than uplink processing. Similarly, when the mobile device uploads information to the network, uplink processing may require significantly more of the bandwidth. By dynamically adjusting the number of time slots used for downlink and uplink processing, the system can more easily accommodate asymmetric traffic with different data rate requirements on downlink and uplink than FDD schemes are capable. For example, as the amount of uplink data increases, more bandwidth can dynamically be allocated to the uplink processing.

As discussed above, TD-SCDMA uses both TDMA and CDMA concepts. The synchronous aspect of the TD-SCDMA standard means that uplink signals are synchronized at the base station receiver, achieved by continuous timing adjustments.

SUMMARY

In general, in one aspect, a dual-port frame memory has a first access port and a second access port in which data can be written to the dual-port frame memory through the first access port at the same time that data is read from the dual-port frame memory through the second access port; a bit rate processor performs bit rate processing on input data and writes data resulting from the bit rate processing to the dual-port frame memory through the first access port; a chip rate processor reads data from the dual-port frame memory through the second access port and performs chip rate processing on the data read from the dual-port frame memory; and a data processor executes a software application that writes data to the dual-port frame memory through the first access port and reads data from the dual-port frame memory through the second access port.

Implementations may include one or more of the following features. The bit rate processor performs at least one of channel encoding, interleaving, rate matching, and physical channel mapping on the input data. The chip rate processor performs at least one of spreading data, scrambling data, and combining data from multiple physical channels to prepare data for uplink transmission. A first multiplexer multiplexes write requests from the bit rate processor and the software application, and a second multiplexer multiplexes read requests from the chip rate processor and the software application. The bit rate processor and the chip rate processor have higher priority than the software application such that the first multiplexer allows the software application to write to the dual-port frame memory only when the bit rate processor is not writing to the dual-port frame memory and allows the software application to read from the dual-port frame memory only when the chip rate processor is not reading from the dual-port frame memory. The software application has information on operations of the bit rate processor and is configured to write to the dual-port frame memory during time periods in which the bit rate processor is not writing to the dual-port frame memory. The software application has information on operations of the chip rate processor and is configured to read from the dual-port frame memory during time periods in which the chip rate processor is not reading from the dual-port frame memory. The bit rate processor and the chip rate processor process data according to Code Division Multiple Access standard, Wideband Code Division Multiple Access standard, or Time Division-Synchronous Code Division Multiple Access standard.

The dual-port frame memory includes a first buffer to store a first frame of data and a second buffer to store a second frame of data. At some time periods the bit rate processor writes to the first buffer and the chip rate processor reads from the second buffer, and at other time periods the bit rate processor writes to the second buffer and the chip rate processor reads from the first buffer. The first buffer includes a first portion for storing data associated with a first sub-frame and a second portion for storing data associated with a second sub-frame, the first portion including five segments each for storing data associated with one of five active time slots of the first subframe, the second portion including five segments each for storing data associated with one of five active time slots of the second subframe. The frame memory is divided into segments each associated with a time slot, and each segment stores data associated with at least two physical channels when a spreading factor is greater than 1. Each segment stores data associated with a single physical channel when the spreading factor is equal to 1 or when there is only one physical channel in a time slot. The software application performs bit rate processing on input data and writes data resulting from the bit rate processing to the dual-port frame memory through the first access port.

The bit rate processor performs bit rate processing for a first channel, and the software application performs bit rate processing for a second channel. The first and second channels include a transport channel and a control channel. When a first channel and a second channel are associated with a time slot, the bit rate processor and the data processor are operable in three modes in which in the first mode, the software application performs bit rate processing for the first and second channels, in the second mode, the bit rate processor performs bit rate processing for the first and second channels, and in the third mode, the bit rate processor performs bit rate processing for the first channel and the software application performs bit rate processing for the second channel. The bit rate processor performs bit rate processing using a fixed algorithm and the software application performs bit rate processing using an algorithm specified by software code that can be updated. The software application performs chip rate processing on data read from the dual-port frame memory through the second access port. The chip rate processor performs chip rate processing for a first time slot and the software application performs chip rate processing for a second time slot. The chip rate processor performs chip rate processing using a fixed algorithm and the software application performs chip rate processing using an algorithm specified by software code that can be updated.

In general, in another aspect, bit rate processing is performed using a bit rate processor and data resulting from the bit rate processing is written to a dual-port frame memory through a first access port of the dual-port frame memory, the dual-port frame memory allowing data to be written to the dual-port frame memory through the first access port at the same time that data is read from the dual-port frame memory through a second access port of the dual-port frame memory. Data are read from the dual-port frame memory through the second access port and chip rate processing is performed on the data read from the dual-port frame memory using a chip rate processor. A software application is executed on a data processor in which the software application writes data to the dual-port frame memory through the first access port and reads data from the dual-port frame memory through the second access port.

Implementations may include one or more of the following features. Performing the bit rate processing includes performing at least one of channel encoding, interleaving, rate matching, and physical channel mapping on input data. Performing the chip rate processing includes performing at least one of spreading data, scrambling data, and combining data from multiple physical channels to prepare data for uplink transmission. Write requests from the bit rate processor and the software application are multiplexed, and read requests from the chip rate processor and the software application are multiplexed. The bit rate processor is given a higher priority than the software application and the software application is prevented from writing to the dual-port frame memory when the bit rate processor is writing to the dual-port frame memory. The chip rate processor is given a higher priority than the software application and the software application is prevented from reading from the dual-port frame memory when the chip rate processor is reading from the dual-port frame memory.

The software application controls operation of the bit rate processor and the software application writes to the dual-port frame memory when the bit rate processor is not writing to the dual-port frame memory. The software application controls operation of the chip rate processor and the software application reads from the dual-port frame memory when the chip rate processor is not reading from the dual-port frame memory. Performing the bit rate processing and the chip rate processing includes processing data according to Code Division Multiple Access standard, Wideband Code Division Multiple Access standard, or Time Division-Synchronous Code Division Multiple Access standard. A first frame of data is written into a first segment of the dual-port frame memory and a second frame of data is written into a second segment of the dual-port frame memory. The bit rate processor writes data into the first segment and the chip rate processor reads data from the second segment during a first time period, and the bit rate processor writes data into the second segment and the chip rate processor reads data from the first segment during a second time period. The software application performs bit rate processing on input data and writes data resulting from the bit rate processing to the dual-port frame memory through the first access port.

When there are two physical channels in a time slot, in some examples, the bit rate processor performs bit rate processing for both channels; in some examples, the software performs bit rate processing for both channels; and in some examples, the bit rate processor performs bit rate processing on data associated with a first channel and the software application performs bit rate processing on data associated with a second channel. The bit rate processor performs bit rate processing using a fixed algorithm and the software application performs bit rate processing using an algorithm specified by software code that can be updated. The software application reads data from the dual-port frame memory through the second access port and performs chip rate processing on the data read from the dual-port frame memory. The chip rate processor performs chip rate processing on data associated with a first time slot and the software application performs chip rate processing on data associated with a second time slot. The chip rate processor performs chip rate processing using a fixed algorithm and the software application performs chip rate processing using an algorithm specified by software code that can be updated.

In general, in another aspect, a wireless device includes a dual-port frame memory, a bit rate processor, a chip rate processor, a transmitter, and a general purpose digital signal processor. The dual-port frame memory has a first access port and a second access port in which data can be written to the dual-port frame memory through the first access port at the same time that data is read from the dual-port frame memory through the second access port. The bit rate processor performs bit rate processing on input data and writes data resulting from the bit rate processing to the dual-port frame memory through the first access port, the bit rate processing including at least one of channel encoding, interleaving, rate matching, and physical channel mapping on the input data. The chip rate processor reads data from the dual-port frame memory through the second access port and performs chip rate processing on the data read from the dual-port frame memory, the chip rate processing including at least one of spreading data, scrambling data, and combining data from multiple physical channels to prepare data for uplink transmission. The transmitter wirelessly transmits a signal derived from the data resulting from the chip rate processing. The general purpose digital signal processor executes a software application to control operation of the bit rate processor and the chip rate processor, in which the software application is configured to write data to the dual-port frame memory through the first access port and read data from the dual-port frame memory through the second access port.

In general, in another aspect, a dual-port frame memory has a first access port and a second access port in which data can be written to the dual-port frame memory through the first access port at the same time that data is read from the dual-port frame memory through the second access port. Bit rate processing is performed, and data resulting from the bit rate processing are written to the dual-port frame memory through the first access port. Data are read from the dual-port frame memory through the second access port and chip rate processing is performed on the data read from the dual-port frame memory. A data processor executes a software application that writes data to the dual-port frame memory through the first access port and reads data from the dual-port frame memory through the second access port.

In general, in another aspect, a wireless communication device implements radio frame equalization in compliance with a telecommunications standard that specifies a transmission time interval to be $T0*2^N$ ms, $T0$ being a predetermined time interval, N being any integer ranging from 0 to M, M being a positive integer. A block of channel encoded data of a transport channel is stored in a memory that includes memory lines each having $2^M$ bits. If the block of channel encoded data has a number of bits that is not an integer multiple of $2^M$, one or more padded bits are stored after an end of the block of channel encoded data to an end of a last memory line occupied by the block of channel encoded data. The block of channel encoded data and the padded bits are read from the memory in equal sized segments.

Implementations may include one or more of the following features. The telecommunications standard includes Time Division-Synchronous Code Division Multiple Access standard, or Wideband Code Division Multiple Access standard. For each active transport channel, a block of channel encoded data of the active transport channel is stored in the memory per transmission time interval associated with the respective active transport channel. $T0=10$ ms and $M=3$. The padded bits can have bit values all equal to 0, have bit values all equal to 1, or have random bit values. Storing the one or more padded bits after the end of the block of channel encoded data to the end of the last memory line occupied by the block of channel encoded data is performed without calculating the number of padded bits to be stored.

In general, in another aspect, encoded data are stored in a memory at a rate of one block of encoded data per transmission time interval (TTI), TTI being selected from a set of predetermined values, the memory including memory lines each having a predetermined number of bits that is determined according to the set of predetermined TTI values. For every block of data in which the end of the block of data does not align with an end of a last memory line occupied by the block of data, one or more padded bits are stored after the end of the block of data to the end of the last memory line occupied by the block of data so the last memory line is filled with a portion of the block of data and the one or more padded bits. The block of data and the padded bits are read in one or more equal sized segments.

Implementations may include one or more of the following features. Each TTI value is equal to $T0*2^N$ ms, $T0$ being a predetermined time interval, N being an integer ranging from 0 to M, M being a positive integer. Storing the encoded data, storing the padded bits, and reading the block of data and padded bits comply with Time Division-Synchronous Code Division Multiple Access standard, or Wideband Code Division Multiple Access standard. Bit rate processing front end processing is performed on input data to generate the encoded data. Bit rate processing back end processing is performed on the segments of data read from the memory. Storing the one or more padded bits after the end of the block of data to the end of the last memory line occupied by the block of channel encoded data is performed without calculating the number of padded bits to be stored.

In general, in another aspect, a memory includes memory lines, each memory line having a predetermined number of bits; and a first circuitry stores blocks of data of a transport channel associated with a wireless transmission link in the memory. For each of the blocks of data that has a number of bits that is not an integer multiple of the predetermined number, the first circuitry stores one or more padded bits after an end of the block of data to an end of a last memory line occupied by the block of data. A second circuitry reads the block of data and the padded bits from the memory in one or more equal sized segments.

Implementations may include one or more of the following features. The first circuitry stores a block of data for each active transport channel associated with the wireless transmission link to the memory per transmission time interval associated with the respective transport channel. The first circuitry processes data in compliance with a telecommunications standard that specifies the transmission time interval to be $T0*2^N$ ms, $T0$ being a predetermined time interval, N being any integer ranging from 0 to M, M being a positive integer, and each memory line includes $2^M$ bits. $T0=10$ ms and $M=3$. The second circuitry reads a segment of data from the memory per $T0$ time interval. The first circuitry stores the padded bits after the blocks of data in the memory without performing a calculation on the number of padded bits to be stored after the end of the blocks of data. The first and second circuitry process data in compliance with Time Division-Synchronous Code Division Multiple Access standard. The first circuitry includes a channel encoder. The first circuitry includes a bit rate processing front end processing unit. The second circuitry includes an interleaver that interleaves the data read from the memory. The second circuitry includes a bit rate processing back end processing unit. The padded bits can have bit values all equal to 0 or all equal to 1. The padded bits can have random bit values.

In general, in another aspect, a wireless chipset for processing data for uplink transmission includes a transmission timing interval (TTI) memory, a bit rate processing (BRP) front end processing unit, and a BRP back end processing unit. The TTI memory includes memory lines, each memory line having a predetermined number of bits. The bit rate processing (BRP) front end processing unit stores a block of encoded data in the TTI memory per TTI for each active transport channel, and for each of the blocks of encoded data that has a number of bits that is not an integer multiple of the predetermined number, stores one or more padded bits after an end of the block of encoded data to fill a last memory line occupied by the block of encoded data. The BRP back end processing unit reads each block of encoded data and associated padded bits from the memory in one or more equal sized segments.

Implementations may include one or more of the following features. The bit rate processing front end processing unit stores the one or more padded bits after the end of the block of encoded data to fill the last memory line without performing a calculation on the number of padded bits to be stored after the end of the block of encoded data.

In general, in another aspect, a memory includes memory lines, each memory line having a predetermined number of bits; and a first circuitry stores encoded data in the memory at a rate of one block of encoded data per transmission time interval (TTI), TTI being selected from a set of predetermined values. Padded bits are stored in the memory, in which for every block of encoded data where the end of the block of encoded data does not align with an end of a last memory line occupied by the block of encoded data, padded bits are stored after the end of the block of data to the end of the last memory line occupied by the block of data without calculating a number of padded bits. A second circuitry reads the block of data and the padded bits in one or more equal sized segments.

In general, in another aspect, at least two groups of registers are provided, each group of register storing a set of time slot configuration parameters; a storage stores a sequence of time slot configuration set identifiers each identifying one of the groups of registers, each identifier corresponding to a time slot; and a chip rate processing unit processes a stream of data over a plurality of time slots in which at each of the time slots, and the chip rate processing unit is configured according to the set of time slot configuration parameters stored in the group of register associated with the time slot configuration set identifier corresponding to the time slot.

Implementations may include one or more of the following features. The chip rate processing unit performs at least one of spreading data, scrambling data, and combining data from multiple physical channels to prepare the data for uplink transmission. Each set of time slot configuration parameters include at least one of scrambling code, spreading code, spreading factor, and power control information. The chip rate processing unit operates in compliance with Code Division Multiple Access standard, Wideband Code Division Multiple Access standard, or Time Division-Synchronous Code Division Multiple Access standard. The at least one group of registers include five groups of registers to store five sets of time slot configuration parameters for configuring the chip rate processing unit to process five uplink time slots of a sub-frame. Each group of registers can be accessed by the chip rate processing unit within one clock cycle. The sets of time slot configuration parameters are stored in the first storage in a sequence that is different from a sequence in which the sets of time slot configuration parameters are used to configure the chip rate processing unit. A multiplexer multiplexes the sets of time slot configuration parameters from the groups of registers, the multiplexer selecting one of the sets of time slot configuration parameters during each time slot based on the sequence of identifiers and sending the selected set of time slot configuration parameters to the chip rate processing unit. The storage that stores the sequence of identifiers includes a first-in-first-out queue. A data processor executes software to write the sets of time slot configuration parameters to the groups of registers and causes the identifiers to be written to the storage to control processing of the stream of data by the chip rate processing unit.

In general, in another aspect, a first storage stores at least two sets of configuration parameters; a second storage stores a sequence of identifiers each corresponding to one set of configuration parameters; a special purpose data processor processes a stream of data in which the special purpose data processor is configured differently at different time periods according to the sets of configuration parameters associated with the sequence of identifiers; and a general purpose data processor writes the sets of configuration parameters to the first storage and the sequence of identifiers to the second storage to control processing of the stream of data by the special purpose data processor.

Implementations may include one or more of the following features. The special purpose data processor includes an uplink chip rate processor. The first storage includes groups of registers that can be accessed by the special purpose data processor through a multiplexer, each group of registers storing a set of configuration parameters. The first storage can be accessed by the special purpose data processor in one clock cycle. The second storage includes a first-in-first-out queue. Each identifier in the sequence of identifiers corresponds to a time slot in a sequence of time slots, and the same set of configuration parameters is reused for different time slots by having the sequence of identifiers include a same identifier multiple times. Each set of configuration parameters includes at least one of scrambling code, spreading code, spreading factor, and power control information.

In general, in another aspect, at least two sets of time slot configuration parameters are written to at least two groups of registers, each time slot configuration parameter having information on how data is to be processed by a chip rate processing unit during a time slot; and a sequence of identifiers is written to a storage, each identifier being associated with one of the groups of registers. At each of a plurality of time slots, one set of time slot configuration parameters stored in a group of registers is selected according to the sequence of identifiers, the chip rate processing unit is configured according to the selected set of time slot configuration parameters, and data are processed using the chip rate processing unit.

Implementations may include one or more of the following features. Writing at least two sets of time slot configuration parameters includes writing five sets of time slot configuration parameters for configuring the chip rate processing unit to process five uplink time slots of a sub-frame. Processing data using the chip rate processing unit includes performing at least one of spreading data, scrambling data, and combining data from multiple physical channels to prepare the data for uplink transmission. The chip rate processing unit operates in compliance with Code Division Multiple Access standard, Wideband Code Division Multiple Access standard, or Time Division-Synchronous Code Division Multiple Access standard. The sets of time slot configuration parameters are multiplexed to select one set of time slot configuration parameters for configuring the chip rate processing unit. Software is executed in a data processor to specify what time slot configuration parameters are written to the first storage and which identifiers are written to the second storage. Writing a sequence of identifiers to the storage includes writing the sequence of identifiers to a first-in-first-out queue. A sequence of identifiers having a same identifier multiple times is written to the storage to re-use the set of time slot configuration parameters stored in the group of registers corresponding to the identifier without re-writing the set of time slot configuration parameters to the group of registers multiple times. Writing the time slot configuration parameters includes writing at least one of scrambling code, spreading code, spreading factor, and power control information.

In general, in another aspect, a stream of data is processed using a special purpose processor, and a general purpose processor controls configurations of the special purpose processor when processing a stream of data over time by writing two or more sets of configuration parameters to a first storage, writing a sequence of identifiers to a second storage, each identifier being associated with a set of configuration parameters, and causing the special purpose processor to be configured differently according to various sets of configuration parameters at different time periods, using the sequence of identifiers to determine a sequence in which the different sets of configuration parameters are used to configure the special purpose processor.

Implementations may include one or more of the following features. The special purpose processor includes a chip rate processor. Writing two or more sets of configuration parameters to a first storage includes writing two or more sets of configuration parameters to two or more groups of registers, each group of register storing a set of configuration parameters. Writing the sequence of identifiers to a second storage includes writing the sequence of identifiers to a first-in-first-out queue. Each set of time slot configuration parameters includes at least one of scrambling code, spreading code, spreading factor, and power control information. The general purpose processor executes software to determine which sets of configuration parameters are to be written to the first storage and which identifiers are to be written to the second storage to enable the special purpose processor to process the stream of data according to a telecommunications protocol. The telecommunications protocol includes Code Division Multiple Access standard, Wideband Code Division Multiple Access standard, or Time Division-Synchronous Code Division Multiple Access standard.

These and other aspects and features, and combinations of them, may be expressed as methods, apparatus, systems, means for performing functions, program products, and in other ways.

Advantages of the aspects, systems, and methods may include one or more of the following. Radio frame equalization can be performed by adding pad bits for purpose of rate matching without knowledge of the TTI value, eliminating the need for logic to compute the number of pad bits based on the TTI value. The hardware design and verification can be simplified. A bit rate processor, a chip rate processor, and DSP software can share a frame memory without using arbitrators to arbitrate access to the frame memory, reducing complexity of the chip design. Configurations of a chip rate processor and algorithms used for chip rate processing of transmission data during different time slots can be easily adjusted using time-slot configuration files and a trigger FIFO.

DESCRIPTION OF DRAWINGS

FIG. 7 shows a table having a list of example physical channels.

DETAILED DESCRIPTION

This document describes various methods and apparatus for uplink processing that implement TD-SCDMA and include various design features that may facilitate efficient, flexible and cost effective implementation of the TD-SCDMA standard. For example, as will be described in more detail later, a transmission time interval (TTI) memory can be implemented in a way to facilitate easy padding of bits for purpose of rate matching. An interface between bit rate processing and chip rate processing can be implemented in a way to enable a bit rate processor, a chip rate processor, and a software application to share a frame memory without using arbitrators to arbitrate access to the frame memory. Time-slot configuration files and a trigger first-in-first-out memory can be used to provide flexibility in determining how a chip rate processor and corresponding algorithms are configured for chip rate processing of transmission data for different time slots.

Figure 1:
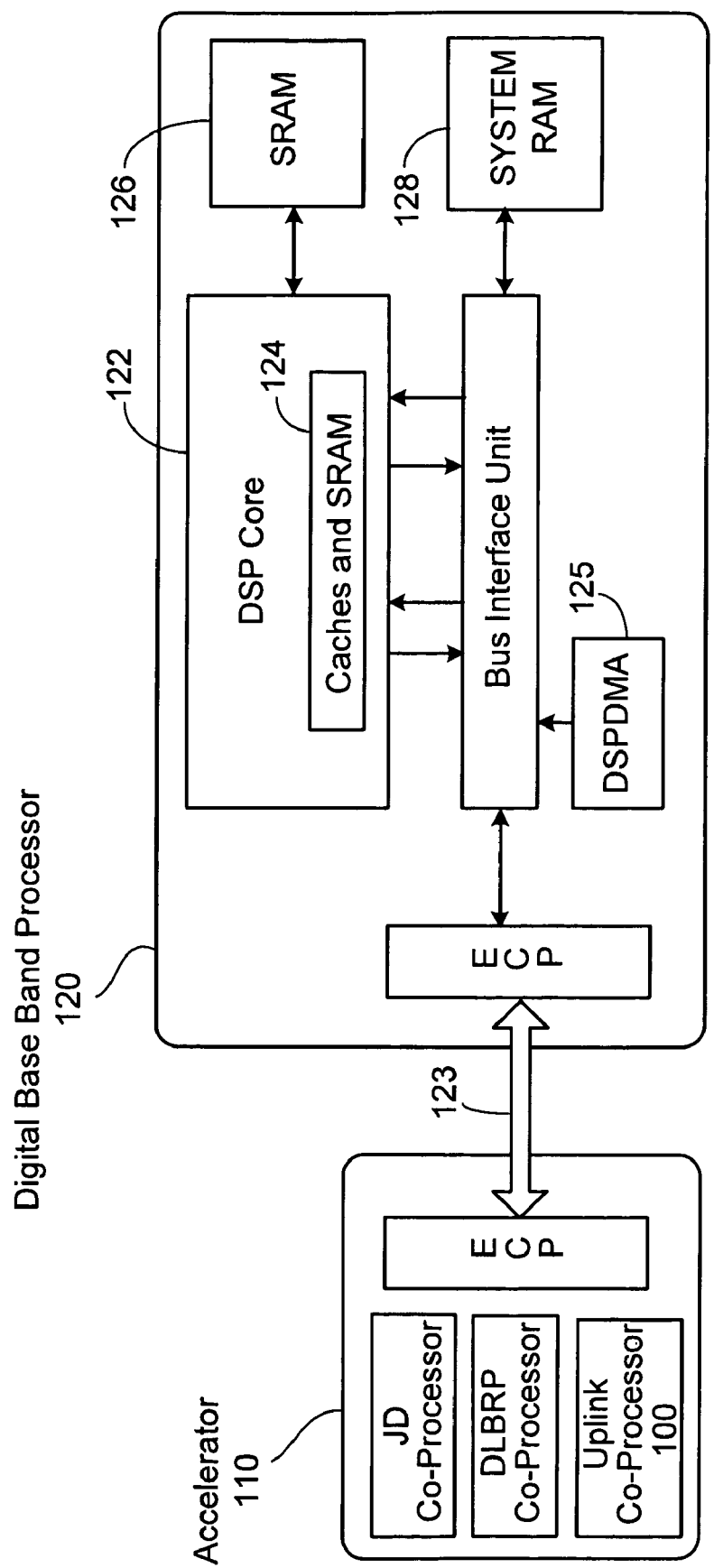
FIG. 1 is a diagram of an example chip architecture.

The following is a list of abbreviations used in this document and their definitions:
BE: Back-End
BRP: Bit Rate Processing
CCTrCH: Coded Composite TrCH
CRC: Cyclic Redundancy Check
CRP: Chip Rate Processing
DBB: Digital Base-Band
DCH: Dedicated Channel
ECP: External Co-processor I/F Port
FE: Front-End
JD: Joint Detection
HW: BRP Hardware BRP
JDA: Joint Detection Accelerator
PhCH: Physical Channel
RF: Radio Frame. Also simply called Frame in opposition to the sub-frame
RM: Rate Matching
RU: Receive Unit
SS: Synchronization Shift
TFCI: Transport Format Combination Indicator
TPC: Transmit Power Control
TrCH: Transport Channel
TrBk: Transport Block
TTI: Time Transmission Interval
TS: Time-Slot
UE: User Equipment Architecture Overview FIG. 1 is a diagram of an example chip architecture that may be used to implement various wireless standards, including TD-SCDMA. A digital base band processor (DBB) 120 is responsible for a number of telecommunications tasks, including transmitting and receiving information to and from a base station during a wireless communication. The digital base band processor 120 includes a DSP core 122 that can execute software code to perform various operations. The DSP core 122 can access cache memory 124, an SRAM 126, and a system RAM 128.

An accelerator 110 may include one or more coprocessors implemented to assist the digital base band processor 120 in performing its telecommunications tasks. For example, the accelerator 110 may include an uplink (UL) coprocessor 100 that performs uplink processing according to the TD-SCDMA standard. The accelerator 100 may include other coprocessors that perform other tasks (e.g., perform downlink processing according to the TD-SCDMA standard). The DSP core 122 may operate as a master of the UL coprocessor 100, providing data received from the base station to the UL coprocessor (downlink) and transmitting data received from the UL coprocessor to the base station (uplink). The software executing on the DSP core 122 is responsible for the control and configuration of the UL co-processor 100. The software application supplies input data and configuration parameters and the UL accelerator 110 produces complex data sequences at the chip-rate.

The following is a brief description of the TD-SCDMA signaling format. TD-SCDMA uses time domain duplexing in combination with multiple access techniques to support both symmetrical and asymmetrical traffic. The variable allocation of time slots for uplink or downlink traffic allows TD-SCDMA to meet asymmetric traffic requirements and to support a variety of users. In TD-SCDMA systems, multiple access techniques employ both unique codes and time signatures to separate the users in a given cell. The TD-SCDMA standard defines a frame structure with three layers: the radio frame, the subframe and the time slot. The radio frame is 10 ms. The subframe is 5 ms and is divided into seven time slots. A time slot has four parts: a midamble, two data fields on each side of the midamble and a guard period. A receiver uses the midamble to perform channel estimation.

Figure 2:
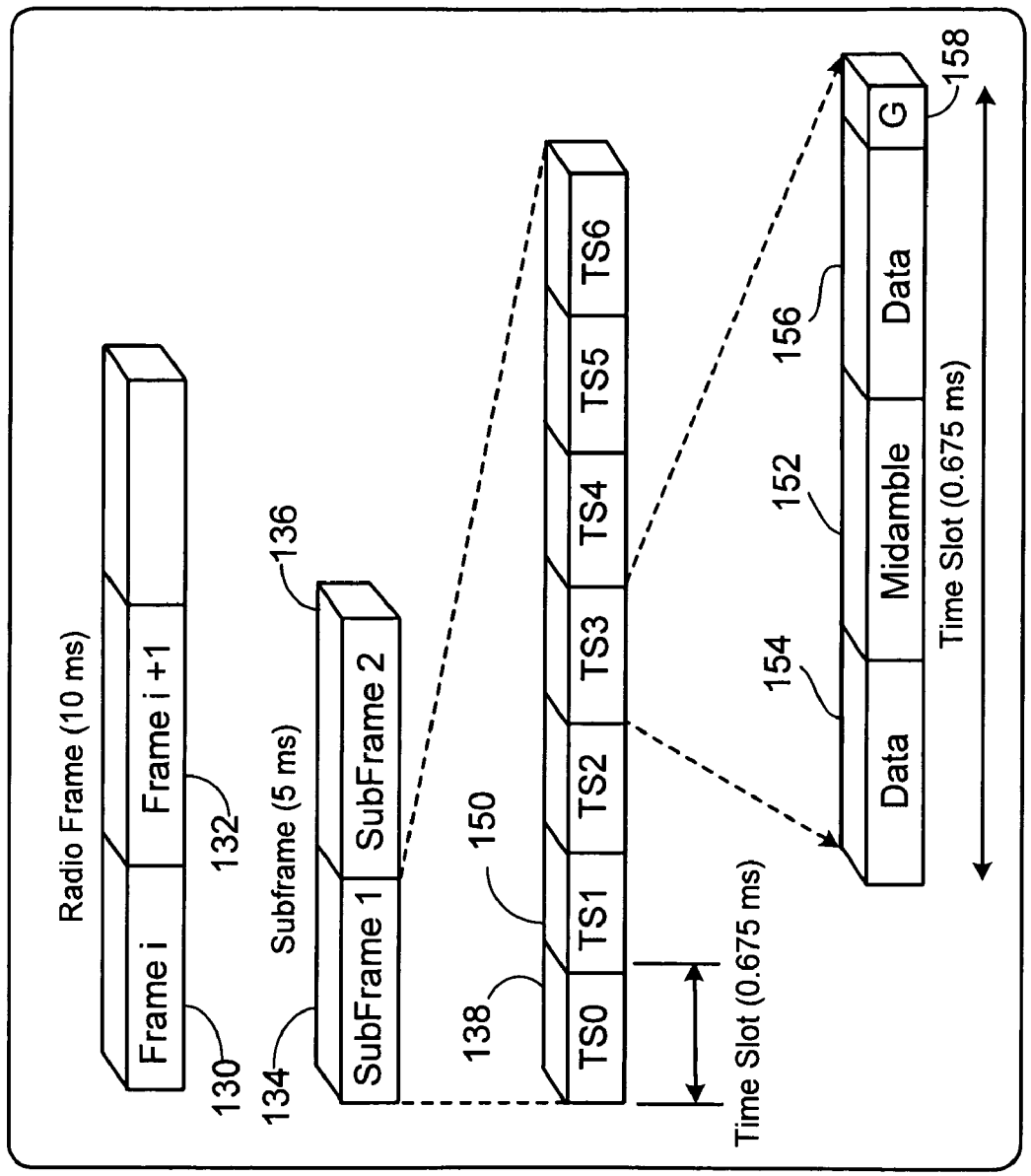
FIG. 2 is a diagram of an example TD-SCDMA data structure.

FIG. 2 shows a schematic representation of an example TD-SCDMA data structure. Data is transmitted as a series of radio frames 130, 132, etc., each having a duration of 10 ms (milliseconds). Each radio frame is divided into two subframes 134 and 136, each having duration of 5 ms. Each subframe is made up of seven time slots TSO 138, TS1 150, etc, each having duration of 0.675 ms. Each time slot includes four parts, a midamble 152 with one hundred and forty-four (144) chips duration, two data fields 154, 156 with three hundred and fifty-two (352) chips duration before and after the midamble 152, followed by a guard period 158 of sixteen (16) chips. The midamble 152 carries known data and is used by the receiver to perform channel estimation. The seven time slots (e.g., TS0, TS1, etc.) in each subframe (e.g., 134 or 136) may be divided between uplink and downlink traffic, according to the traffic in each direction.

In some implementations, the UL co-processor 100 can support requirements and capabilities of the TD-SCDMA Release 4 384 kbps UE class. The co-processor 100 can support peak data rate of 890 kbps and up to 5 time slots per sub-frame. There can be up-to 2 physical channels per time slot and the spreading factor of each physical channel can be 16, 8, 4, 2 or 1. The co-processor 100 may also support the CRP of HS-SICH, which is the high speed shared information channel used for signaling feedback information of the high speed data.

The physical channels (except for random access channel (RACH) and the HS-SICH) of the TD-SCDMA specification have TTI durations greater than or equal to 10 ms. The TTI duration of the random access channel can be 5 ms, 10 ms, or 20 ms. The co-processor 100 supports the CRP for both RACH and HS-SICH. The BRP for HS-SICH can be performed by software.

The co-processor 100 supports BRP bypass mode for the CCTrCH's. This allows the software application to bypass the hardware BRP and directly feed data to the input of the CRP. The CRP for RACH and HS-SICH can be supported by hardware.

Figure 3:
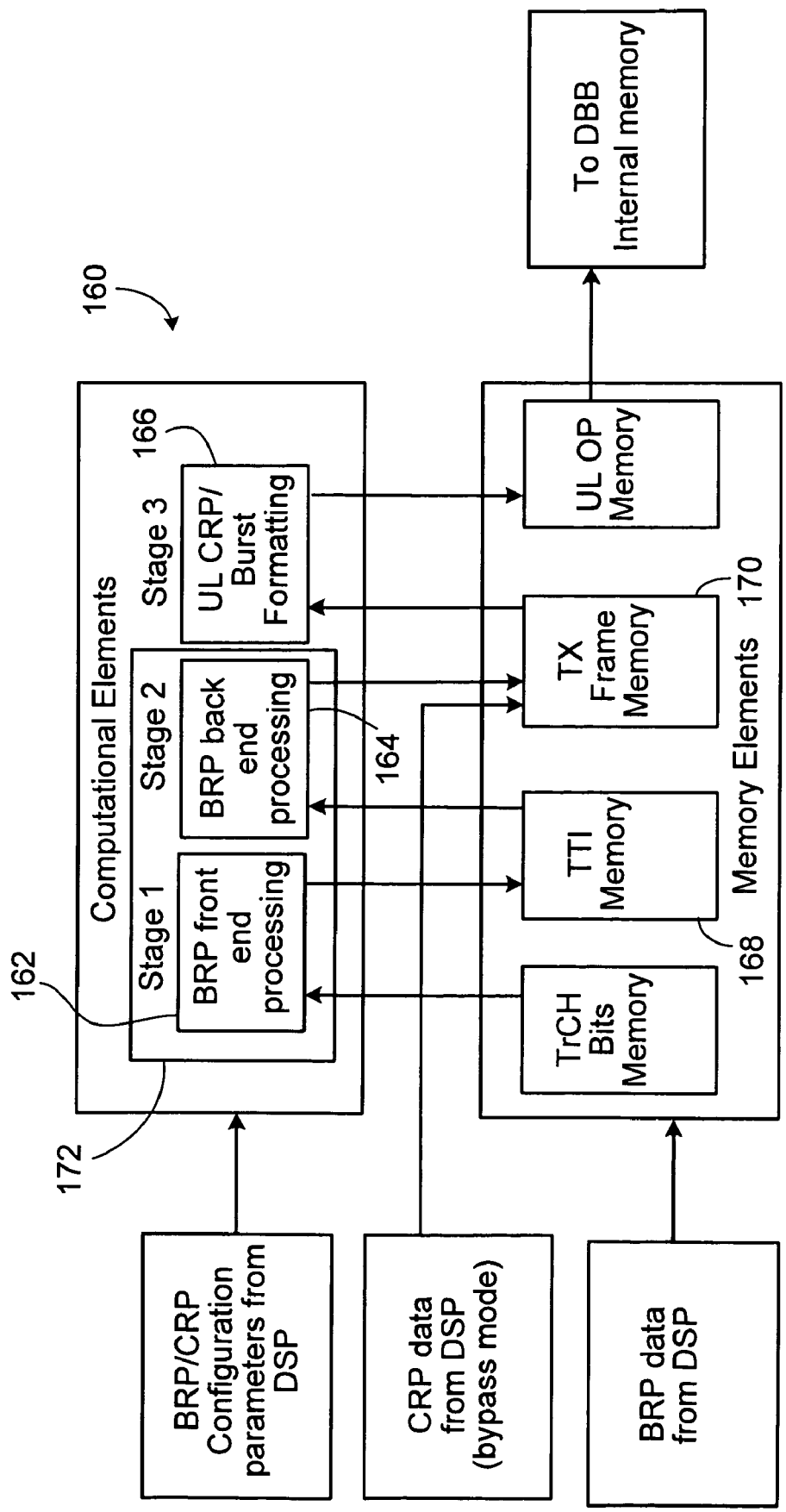
FIG. 3 is a diagram of an example high level architecture of a TD-SCDMA uplink transmit path.

FIG. 3 shows an example high level architecture of the TD-SCDMA uplink transmit path 160. The UL transmit path 160 is partitioned into three main computational elements.

UL BRP front end processing (transport channel processing) 162: This includes CRC attachment and channel encoding. The output of front end processing 162 is stored in a TTI memory 168.

UL BRP back end processing 164: This includes the remaining BRP blocks, such as TrCH interleaving, rate matching, bit scrambling, second interleaver, and physical channel mapping. The output of the back end processing 164 is stored in a transmit frame memory 170. The processing of the BRP back end is scheduled on a frame rate.

The UL BRP front end processing 162 and UL BRP back end processing 164 are collectively referred to as UL BRP processing 172.

UL CRP 166: This includes modulating, spreading, scrambling, and physical channel power weighing and burst formatting. The input to the UL CRP 166 is stored in the transmit frame memory 170 by the BRP backend processing 164, or written directly into the transmit frame memory 170 by the DSP software when in BRP bypass mode. The output of the CRP processing is first transferred to an internal memory or a first-in-first-out buffer of the accelerator 110 (FIG. 1) before transferring to an input/output port.

Note that in this description, depending on context, a functional block in the figure may represent a processing step or a hardware module for implementing the processing step. For example, the block 162 in FIG. 3 can represent the UL BRP front end processing 162 or a UL BRP front end processor 162 (hardware) for carrying out the UL BRP front end processing. The block 172 can represent the UL bit rate processing 172 or a UL bit rate processor 172 for carrying out the bit rate processing. Similarly, the block 166 can represent the UL chip rate processing 166 or a UL chip rate processor 166 for carrying out the UL chip rate processing.

In some implementations, the BRP processing 172 is activated by writing to a BRP trigger register. The DSP software ensures that BRP input data and parameters have reached the hardware before writing to the trigger register. The CRP processing 166 is activated by writing to a slot trigger register. The software ensures the BRP processing 172 is complete (all data has reached the frame memory 170 in case of bypass mode) and the slot configuration parameters have reached the hardware before writing the slot trigger register.

Efficient Radio Frame Equalization Implementation

The following describes an efficient radio frame equalization implementation for TD-SCDMA systems. Between the BRP front end processing 162 (e.g., channel encoding) and the BRP back end processing 164 (e.g., interleaving process) there may be included a radio frame equalization (RFE) process. The RFE process includes padding an input bit sequence of a transport channel in order to ensure that the output can be segmented into a selected number (Fi) of data segments of the same size. This padding can be performed in compliance with the 3GPP specification for TD-SCDMA.

In some implementations, the BRP front end processing 162 can include initial processing of data up to and including channel encoding, and the BRP back end processing 164 can include interleaving of data and subsequent processing of data. The BRP front end processing 162 may process data according to a frame rate equal to the TTI, whereas the BRP back end processing 164 may process data according to a frame rate of 10 ms. The radio frame equalization process is useful to match the frame rate of the front end processing 162 and the back end processing 164.

Figure 4:
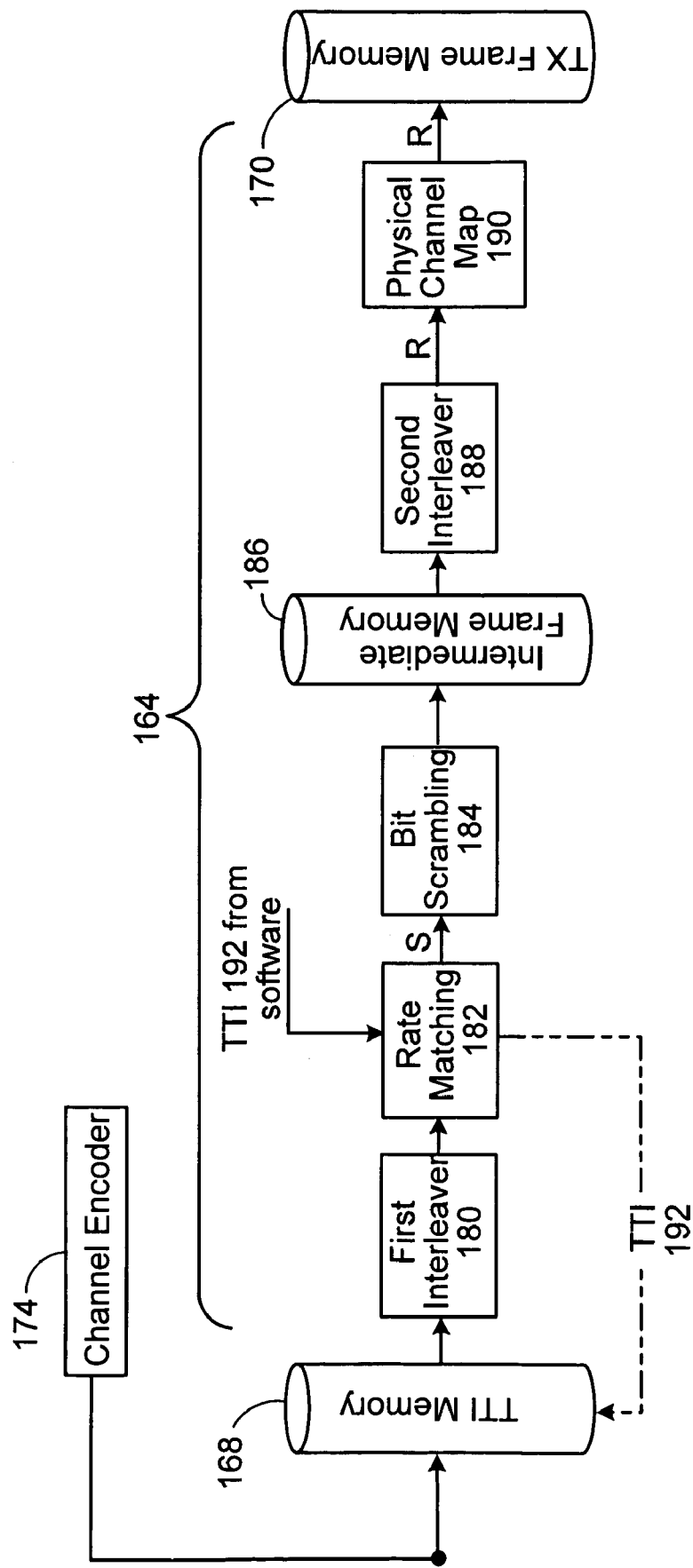
FIG. 4 is a diagram of a portion of a BRP back end processing.

For example, a channel encoder 174 (which is part of the BRP front end processor 162 and is shown in FIG. 4) sends data to the TTI memory 168 according to the TTI. When TTI=10 ms, the encoder 174 sends a transport channel encoded block to the TTI memory 168 every 10 ms. When TTI=20 ms, the channel encoder 174 sends a transport channel encoded block to the TTI memory 168 every 20 ms, etc. When there are multiple active transport channels, the channel encoder 174 sends a transport channel encoded block to the TTI memory 168 for each transmission time interval associated with the transport channel. In this description, the term "transport channel encoded block" refers to a block of data that is output from the channel encoder 174 and written to the TTI memory 168 every preset period of time (10 ms in this example), and is different from the term "transport block", which refers to a basic unit for data transfer between a Media Access Control (MAC) sub-layer and a Physical Layer (Layer 1) specified in the seven-layer OSI Model (Open Systems Interconnection Basic Reference Model).

For example, suppose there are two active transport channels, transport channel 1 and transport channel 2, and suppose transport channel 1 uses TTI=40 ms and transport channel 2 uses TTI=20 ms. Initially, at time T=0, the channel encoder 174 sends a first transport channel encoded block for transport channel 1 and a first transport channel encoded block for transport channel 2 to the TTI memory 168. At time T=20 ms, the channel encoder 174 sends a second transport channel encoded block for the transport channel 2 to the TTI memory 168. At time T=40 ms, the channel encoder 174 sends a second transport channel encoded block for transport channel 1 and a third transport channel encoded block for transport channel 2 to the TTI memory 168, and so forth. After data are stored in the TTI memory 168, the data are read out of the TTI memory 168 at a frame rate of 10 ms.

The number of equal size data segments depends on the transmission time interval (TTI), which may be 10 ms, 20 ms, 40 ms, or 80 ms. The number of equal size data segments in each transport channel encoded block is 1, 2, 4 and 8 for the TTI intervals of 10 ms, 20 ms, 40 ms, and 80 ms, respectively. In some implementations, computation of the number of data segments for each transport channel encoded block is based on the TTI, and the number of data segments determines how many bits need to be padded based on a given transport channel encoded block, as discussed in further detail below. In some implementations, TTI is determined by higher level software that may not be available until further downstream in the UL BRP. Thus, it is useful to implement the TTI memory structure in a way such that the desired number of pad bits can be added to a given transport channel encoded block without knowing the TTI value.

FIG. 4 illustrates one implementation of a portion of the BRP back end processing 164. During the RFE process, data from the BRP front end processing 162 is stored in the TTI memory 168 according to the TTI requirements. That is, each transport channel encoded block is logically split into the appropriate number of data segments, the last data segment being padded to be equal to the size of the other data segments. The data segments stored in the TTI memory 168 are read by a first interleaver 180, which scrambles the order of the data segments to be transmitted to prevent contiguous data segments from being lost during transmission. The first interleaver 180 provides the data to a rate matching unit 182, which adjusts the data rates to match the transmit data rates by either duplicating or removing bits. Further details of the downstream stages of the BRP path illustrated in FIG. 4 are described in U.S. Provisional Application 61/008,345. In the example of FIG. 4, the TTI values 192 may not be available to the TTI memory 168 until the rate matching stage 182, which may receive the TTI values 192 from higher level software.

According to 3GPP TS 25.222 Technical Specification (3rd Generation Partnership Project, Technical Specification Group Radio Access Network, Multiplexing and channel coding (TDD)), radio frame size equalization is padding the input bit sequence in order to ensure that the output can be segmented in $F_i$ data segments of the same size. The number ($F_i$) of data segments depends on the transmission time interval. For example, if TTI=10 ms, $F_i$=1; if TTI=20 ms, $F_i$=2; if TTI=40 ms, $F_i$=4; if TTI=80 ms, $F_i$=8.

The input bit sequence to the radio frame size equalization is denoted by $c_{i1}, c_{i2}, c_{i3}, \ldots, c_{iE_i}$, where i is TrCH number and $E_i$ is the number of input bits. The output bit sequence is denoted by $t_{i1}, t_{i2}, t_{i3}, \ldots, t_{iT_i}$, where $T_i$ is the number of output bits. The output bit sequence can be derived as follows:

$t_{ik}=c_{ik}$, for $k=1 \ldots E_i$, and $t_{ik}=\{0,1\}$ for $k=E_i+1 \ldots T_i$, if $E_i<T_i$, where $T_i=F_i*N_i$, and $N_i$ is the number of bits per segment after size equalisation.

Figure 5A:
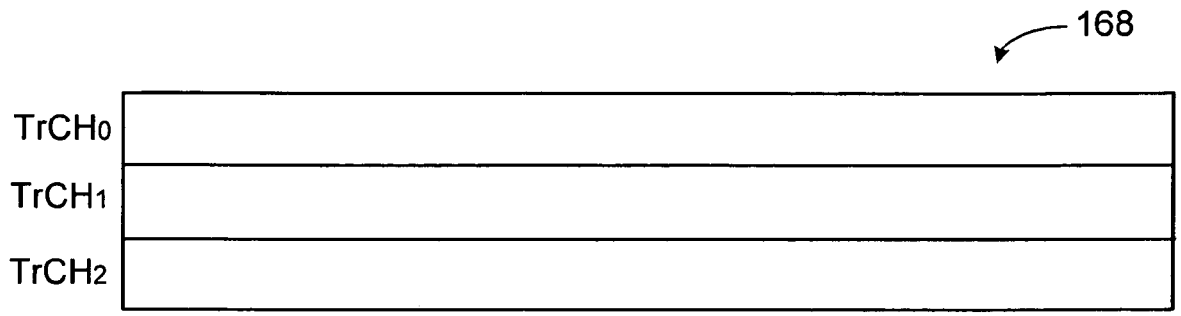
FIGS. 5A to 5D are diagrams of portions of a TTI memory.
Figure 5B:
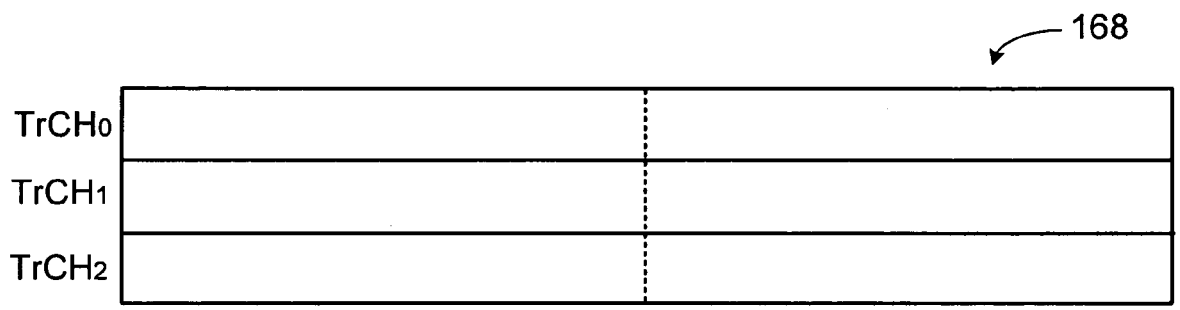
Figure 5C:
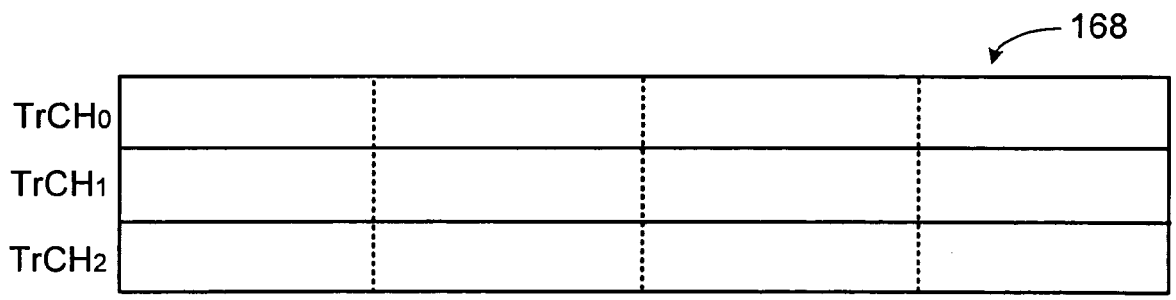
Figure 5D:
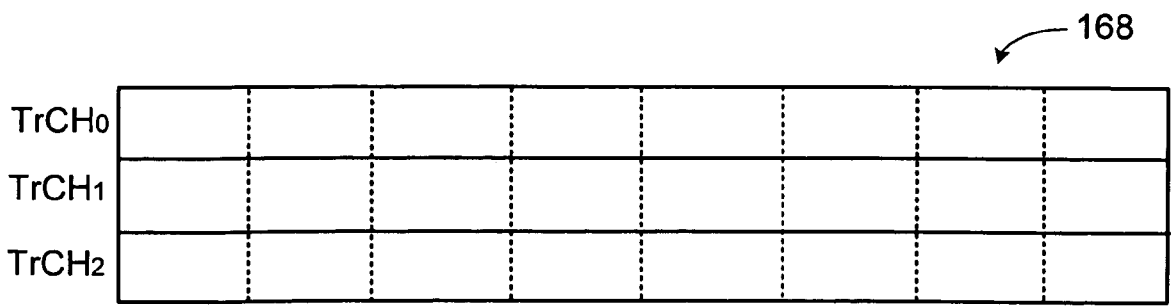

FIGS. 5A, 5B, 5C, and 5D illustrate portions of the TTI memory 168 in which Fi equal to each of 1, 2, 4 and 8, respectively. For example, FIG. 5A illustrates transport channel 0 to transport channel 2 for a single segment (Fi=1). FIG. 5B illustrates transport channel 0 to transport channel 2 for 2 segments (Fi=2), FIG. 5C illustrates transport channel 0 to transport channel 2 for four segments (Fi=4), and FIG. 5D illustrates transport channel 0 to transport channel 2 for eight segments (Fi=8). Although only the first three transport channel encoded blocks are shown, the TTI memory 168 can include more blocks and can be of any size. The transport channel encoded block size may vary depending on the data, CRC bits and the encoding algorithm performed on the data. Accordingly, except for transport channel encoded blocks that are divisible by the TTI value, anywhere from 1 to 7 bits may be needed to be padded at the end of each transport channel encoded block. The number of bits used for padding will thus depend on the transport channel encoded block size and the TTI value.

As discussed above, the TTI value may not be known after the TTI Memory stage 168. Accordingly, to compute the number of data segments after the TTI Memory stage 168, the upstream stages (e.g., stages after the TTI Memory 168) should have information about the total size of the encoded bits in the TTI Memory 168 and the TTI value itself in order to calculate the number of padded bits. This step adds complexity to the design. Alternatively, radio frame equalization can be done before the TTI Memory 168. But to do this, the total size of the encoded block along with the TTI value may be needed to calculate the padded bits. Additional logic is needed to compute the number of data segments and implement the associated padding of the data provided by the encoder at the TTI memory 168.

Applicant has appreciated that the structure of the TTI memory 168 may be exploited to provide a simple solution to the padding of the input data sequence. In particular, Applicant has appreciated that due to the fact that the TTI memory 168 is byte aligned, the appropriate padding can be computed independent of the TTI value. The TD-SCDMA standard specifies that padding may be performed with either zeroes or ones. An issue arises, however, by using randomly unitialized 0/1 bits in memory (i.e., treating the padded bits as "don't cares"). Since the data passes through many stages, including the first and second interleavers, it may become difficult to identify the padded bits at downstream stages (e.g., at the transmit frame memory 270). This may require considerable hardware verification effort to identify the padded random 0/1 bits from the interleaved bit stream. Accordingly, Applicant has appreciated that padding with either all zeroes or all ones facilitates downstream processing. This reduces the complexity in hardware verification. While Applicant selects zeroes for padding, ones could equally be used.

Returning to the concept of utilizing the organization of memory to facilitate relatively simple padding, Applicant has appreciated that because the TTI memory 310 is byte aligned, a transport channel encoded block may be appropriately padded by identifying the end of the data and padding out to the next byte without having to know the value of TTI. Because the next transport channel encoded block will be at the beginning of the next byte, padding out to the next byte boundary will properly pad a transport channel encoded block regardless of the TTI used. The encoder may provide bits to the TTI memory 168 in a bit stream. Thus, to properly pad a transport channel encoded block, the logic may include a mechanism to count how many bits have been transferred to the TTI memory 168. Once a transport channel encoded block has been stored in the TTI memory 168, the logic may add zeros after the end of the transport channel encoded block to the next byte boundary. This insight permits correct padding without relatively expensive feedback logic and hardware to compute the number of bits to pad based on a received TTI that may only be available from downstream stages.

Figure 6:
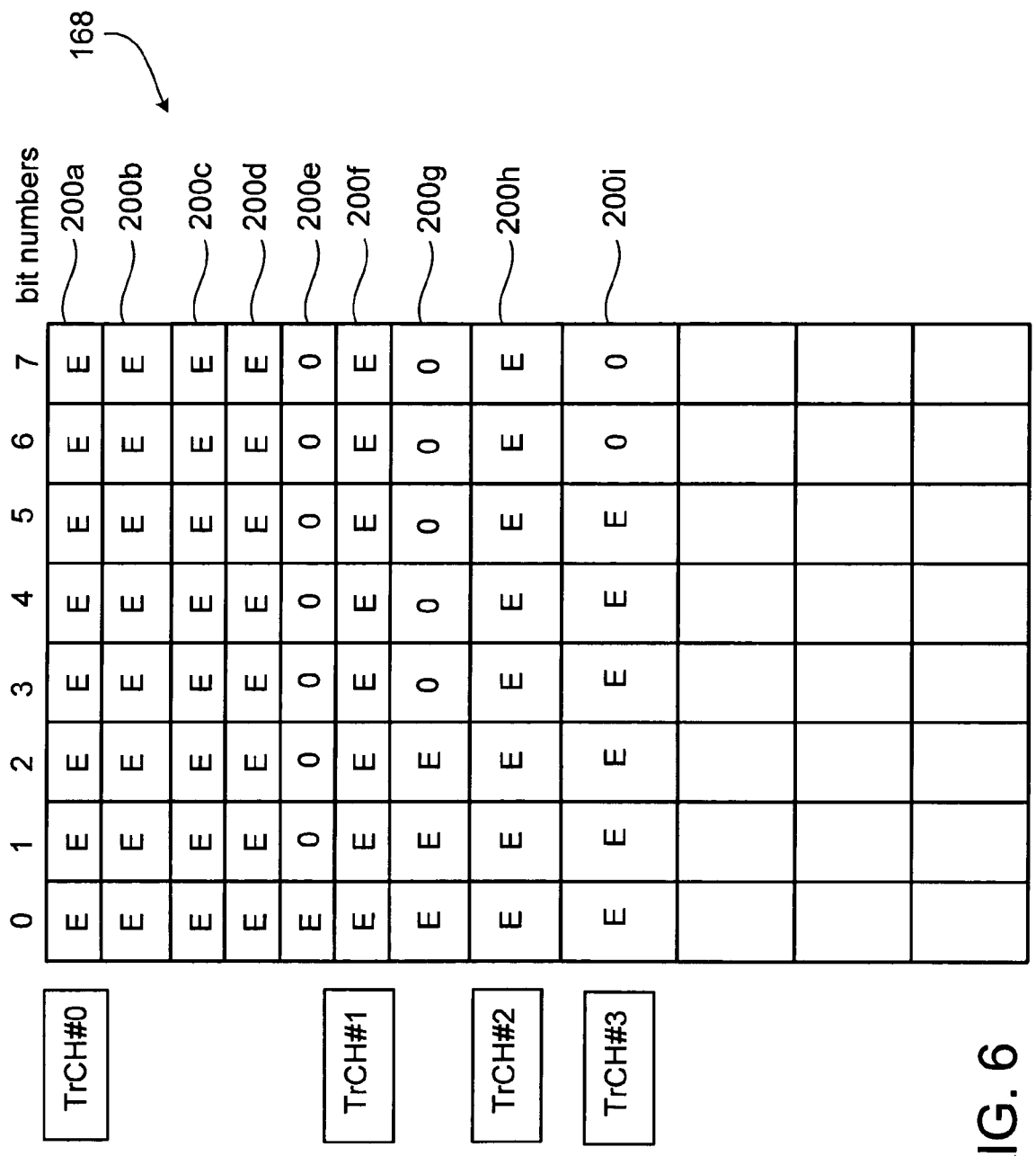
FIG. 6 is a diagram of an example TTI memory structure.

FIG. 6 is an example TTI memory structure that enables padding of extra bits for radio frame size equalization without using information about the TTI value. The TTI memory 168 includes memory lines 200a, 200b, 200c, etc., collectively referenced as 200. Each memory line 200 has 8 bits. When the channel encoder 174 writes encoded data to the TTI memory 168, the channel encoder 174 adds pad bits to the end of the last memory line. In FIG. 6, the symbol "E" represents data bits, and the symbol '0' represents the pad bits.

For example, if a transport channel encoded block for transport channel #0 has 33 bits, the channel encoder 174 writes 32 data bits in four memory lines 200a to 200d, writes 1 data bit in the memory line 200e, and writes 7 pad bits (i.e., '0' bits) in the memory line 200e. If a transport channel encoded block for transport channel #1 has 11 bits, the channel encoder 174 writes 8 data bits in 1 memory line 200f, writes 3 data bits in the memory line 200g, and writes 5 pad bits in the memory line 200g. If a transport channel encoded block for transport channel #2 has 8 bits, the channel encoder 174 writes 8 data bits in 1 memory line 200h without writing additional pad bits. If a transport channel encoded block for transport channel #3 has 6 bits, the channel encoder 174 writes 6 data bits in 1 memory line 200i, and writes 2 pad bits in the memory line 200i.

The number of bits in each transport channel encoded block can range from a few bits to several thousand bits. The number of bits in different transport channel encoded blocks can be different, and the number of bits in the transport channel encoded blocks for the same transport channel can vary at different time periods.

By configuring the TTI memory 168 to have memory lines each having 8 bits, and always adding pad bits to the end of a memory line, and starting the next transport channel encoded block at the start of the next byte boundary, it is not necessary to use information about the TTI value when adding the pad bits. For each transport channel, the total number of data bits plus pad bits will always be divisible by the segment number $F_i$, thus satisfying the radio frame size equalization requirements of the TD-SCDMA standard.

When the transport channel encoded block data are read out from the TTI memory 168, the DSP software will specify the number of bits in each transport channel, the TTI value associated with the transport channel. For example, in the example of FIG. 6, if TTI=40 ms is used for the transport channel #0, the number of segments Fi is equal to 4. The first interleaver 180 needs to read the data bits and a number of pads bits during 40 ms such that the total number of bits is divisible by 4. Since there are 33 data bits, the first interleaver 180 can read the 33 data bits and 3 pad bits, a total of 36 bits (36=9*4) during 40 ms. The first interleaver 180 reads 9 data bits during the first 10 ms, 9 data bits during the second 10 ms, 9 data bits during the third 10 ms, and 6 data bits and 3 pad bits during the fourth 10 ms.

As another example, if TTI=80 ms is used for the transport channel #0, the number of segments Fi is equal to 8. The first interleaver 180 needs to read the data bits and a number of pads bits during 80 ms such that the total number of bits is divisible by 8. Since there are 33 data bits, the first interleaver 180 can read the 33 data bits and 7 pad bits, a total of 40 bits (40=5*8) during 80 ms. The first interleaver 180 reads 5 data bits during each of the first to sixth 10 ms, 3 data bits and 2 pad bits during the seventh 10 ms, and 5 data bits during the eighth 10 ms.

BRP-CRP Interface and Frame Memory Architecture

The following describes a BRP-CRP interface and frame memory architecture. In some implementations, the functionality of uplink path 160 is partitioned between the software executing on the DSP core 122 and the uplink co-processor 100. The uplink co-processor 100 can handle computationally intensive tasks.

Referring to FIG. 7, Table 1 summarizes a list of example physical channels supported by the uplink co-processor 100 and how the tasks can be partitioned between the hardware and software for the different physical channels (see column 206). For example, for a dedicated physical channel 200, the BRP and CRP of data symbols 202 can be performed by hardware, while the BRP of control symbols is performed by software and the CRP of the control symbols is performed by hardware. For a physical random access channel 208, the BRP and CRP of random access signature 210 can be performed by software, while the BRP and CRP of random access channel data 212 are performed by hardware.

As described below, an interface between bit rate processing and chip rate processing can be implemented such that the BRP back end processor 262, the chip rate processor 266, and the software can share the transmit frame memory 270 without using arbitrators to arbitrate access to the transmit frame memory 270.

As illustrated in FIG. 3, the UL bit rate processor 172 provides data that are further processed by the UL chip rate processor 166. The bit rate processor 172 writes data to the transmit frame memory 170 and the UL chip rate processor 166 reads the data from the frame memory 170. Thus, both the hardware for UL BRP 172 and the hardware for UL CRP 166 may require access to the transmit frame memory 170. In addition, software from the DSP core 122 may need to read and write from the transmit frame memory 170. As a result, three separate entities (referred to as masters) may need access to the transmit frame memory 170 resulting in possible bus contention. A conventional solution to handling bus contention is to implement a bus arbiter that performs a desired bus arbitration scheme. For example, FIG. 8 illustrates a conventional solution to memory access where bus contention is a possibility.

Figure 8:
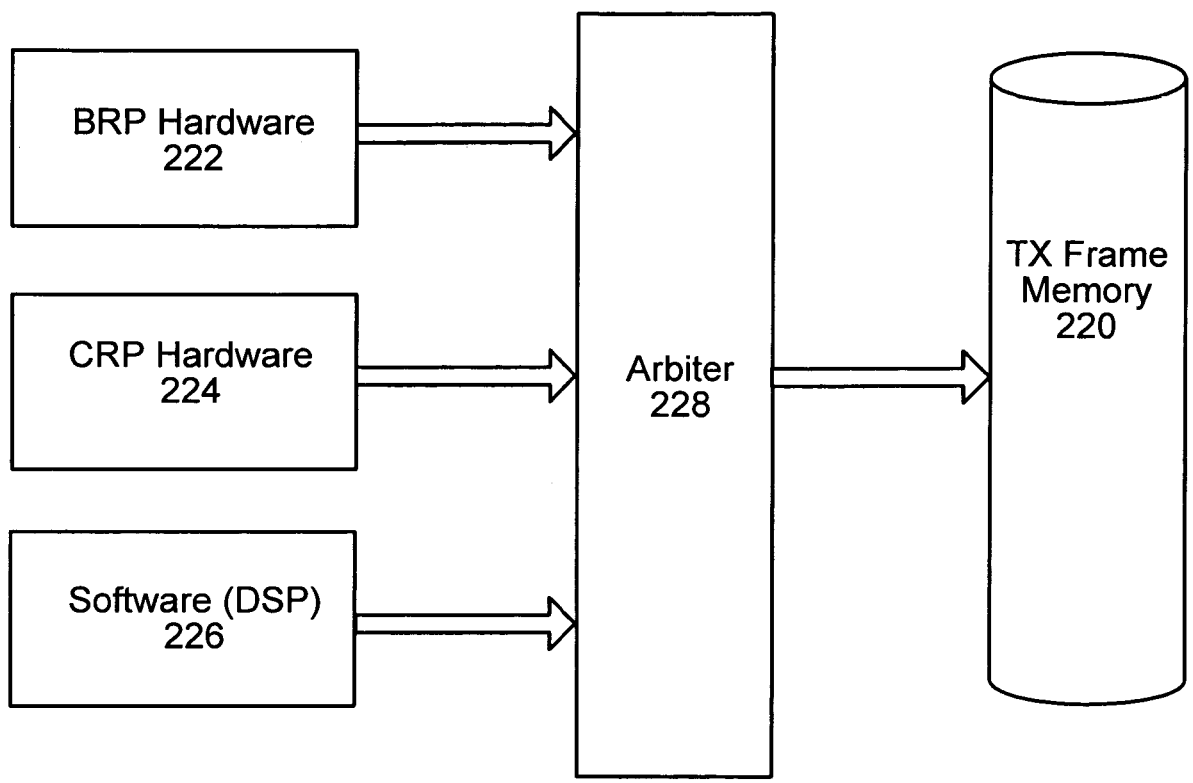
FIG. 8 is a diagram of an example conventional solution to memory access.

In the example of FIG. 8, a transmit frame memory 220 is accessed by three masters: UL BRP hardware 222, UL CRP hardware 224 and DSP software 226. To arbitrate between the various masters, each of which may attempt to access the frame memory 220 simultaneously, an arbiter 228 implements an arbitration scheme to decide which of the contending masters is allocated the bus to access the frame memory 220. Implementing the arbiter 228 may add complexity and cost to the chip design. Implementing arbitration schemes may require complex algorithms to ensure that no master is starved of bus access, while ensuring that high priority processes obtain preference.

Figure 9:
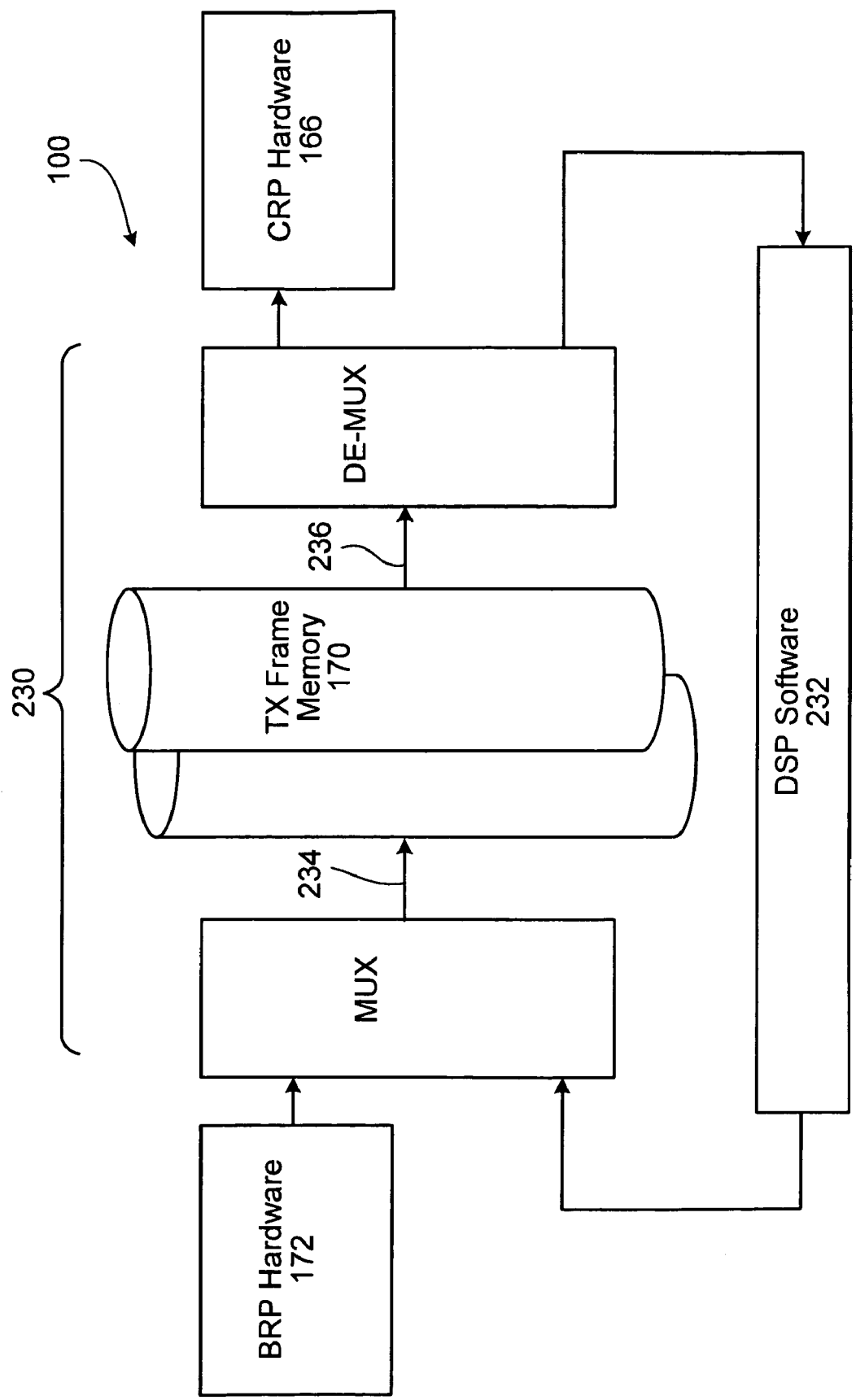
FIGS. 9 and 10 are diagrams of example interfaces between UL BRP and UL CRP.

Referring to FIG. 9, an example memory interface that obviates the need for a bus arbiter to handle multiple-master access to the transmit frame memory. The transmit frame memory 170 is implemented using a dual port memory that allows simultaneous access by two masters, thus reducing one of the possible contentions. The dual port transmit frame memory 170 may be accessed by UL BRP hardware 272, UL CRP hardware 266, and the DSP software 604.

Applicant has appreciated that the nature of the three masters may be used to eliminate the remaining contention. Thus, the dual port memory may be accessed by three masters without the need for bus arbitration. The UL BRP hardware 172 writes to, but does not read from the transmit frame memory 170. UL CRP hardware reads from, but does not write to the transmit frame memory 170. The DSP software 232 both reads from and writes to the transmit frame memory 170. By connecting the UL BRP hardware 172 at a first port 234 of the dual port memory 170 and connecting the UL CRP hardware 166 at a second port 236 of the dual port memory 170, the contention between these two masters may be eliminated. By splitting the DSP software 232 between both ports 234 and 236, the DSP software 232 shares write privileges with the UL BRP 172 and shares read privileges with the UL CRP 166.

Applicant has appreciated that the DSP software 232 has knowledge of when the hardware masters 172 and 166 are reading and writing from the transmit frame memory 170, but the hardware masters 172 and 166 have no knowledge of when the DSP software 232 or the other hardware master is accessing the frame memory 170. Thus, by programming the software master to yield to the hardware masters when the software master detects that the corresponding hardware master is accessing the bus, and splitting the hardware masters between the dual ports 234 and 236, the three masters can access the frame memory 170 without any need for a bus arbiter.

In some implementations, a simple circuit can be added to enforce the policy that hardware reading or writing gets first priority (i.e., the hardware can always assume it has bus access). If it is detected that the UL BRP hardware 172 requires write access to the frame memory 170, the DSP software 232 will be precluded from writing to the frame memory 170. Similarly, if it is detected that the UL CRP hardware 172 requires read access to the frame memory 170, the DSP software 232 will be precluded from writing to the frame memory 170.

Figure 10:
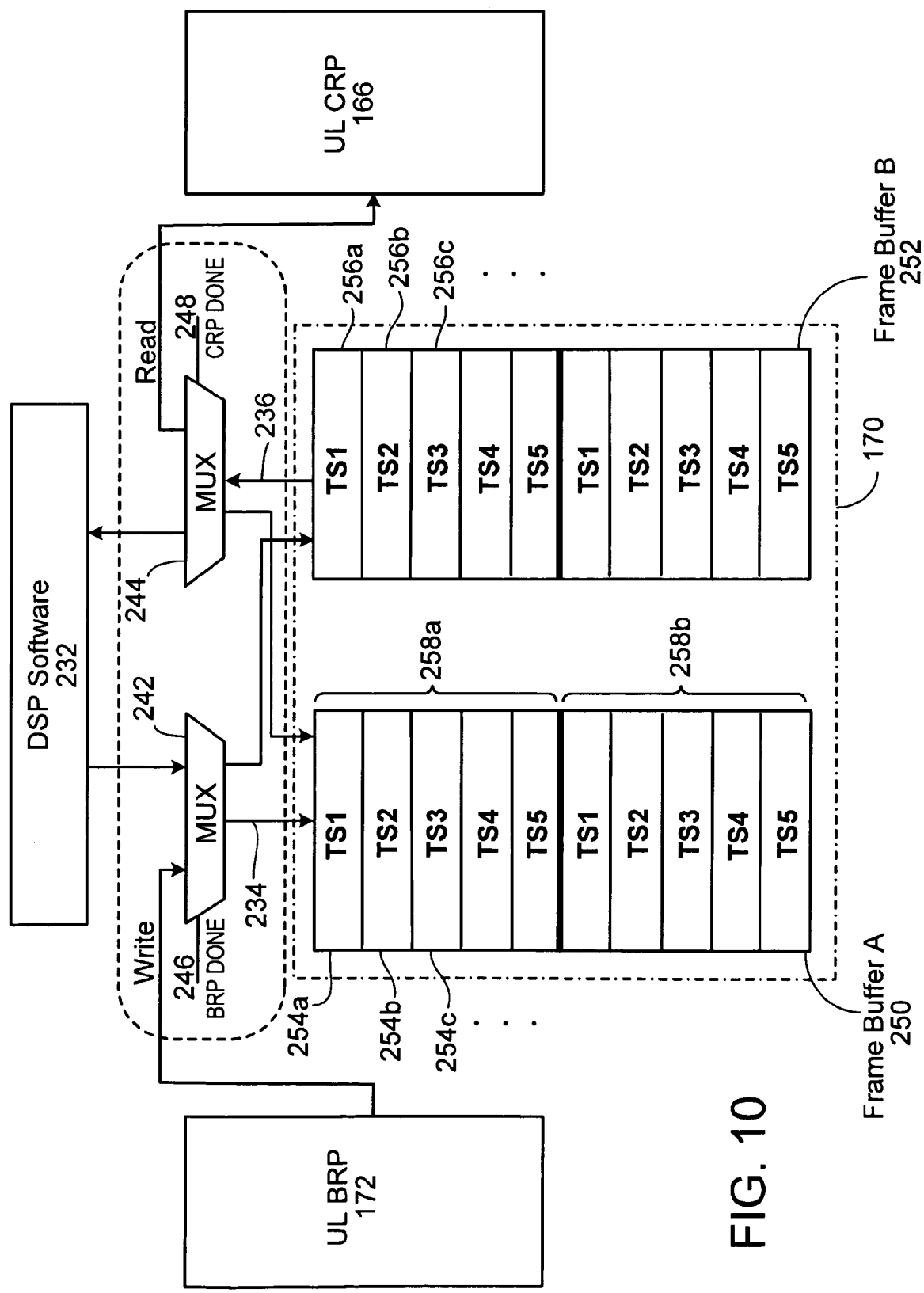

FIG. 10 illustrates a circuit 240 that can be used to enforce the hardware priority policy. The UL BRP hardware 172 accesses the frame memory 170 via a first port 234 by way of a multiplexer 242, and the UL CRP hardware 166 accesses the frame memory 170 via a second port 236 by way of a multiplexer 244. The DSP software 232 performs write accesses via the first port 234 by way of the multiplexer 242 and read accesses via the second port 236 by way of the multiplexer 244.

While the DSP software 232 knows when the hardware is reading or writing and can internally prevent itself from reading or writing simultaneously, it may be beneficial to include the multiplexers 242 and 244 to enforce the policy as it may simplify verification. For example, if the DSP software 232 is performing correctly, the addition logic is redundant and unnecessary. However, if the DSP software 232 is operating incorrectly, the logic provides a failsafe mechanism to enforce the policy. Thus, the logic in FIG. 10 may be used to verify that the DSP software 232 is operating correctly and/or provide an extra measure to ensure the desired policy is being enforced. In some implementations, the multiplexer 242 allows the UL BRP hardware 172 write access unless the BRP DONE select signal 246 is high, at which point the multiplexer 242 will allow the DSP software 232 write access to the frame memory 170. Similarly, the multiplexer 244 allows the UL CRP hardware 166 read access unless the CRP DONE select signal 248 is high, at which point the multiplexer 244 will allow the DSP software 232 read access to the frame memory 170.

Figure 11A:
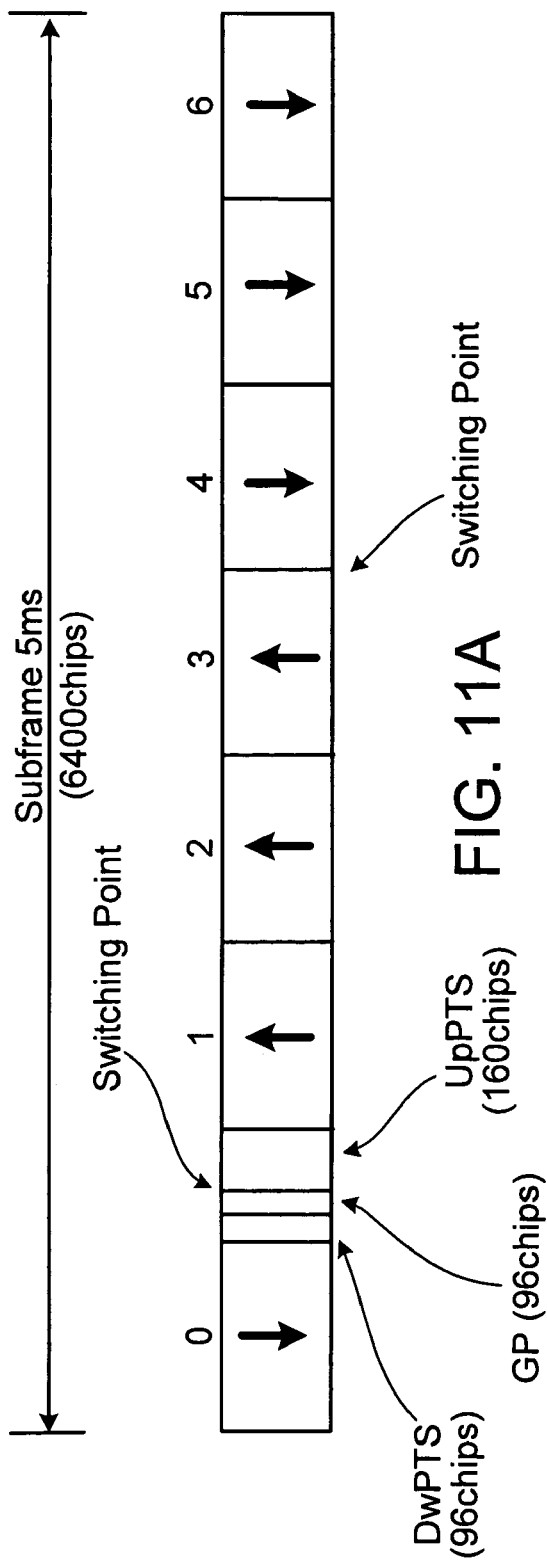
FIGS. 11A and 11B are diagrams of an example TD-SCDMA frame structure.
Figure 11B:
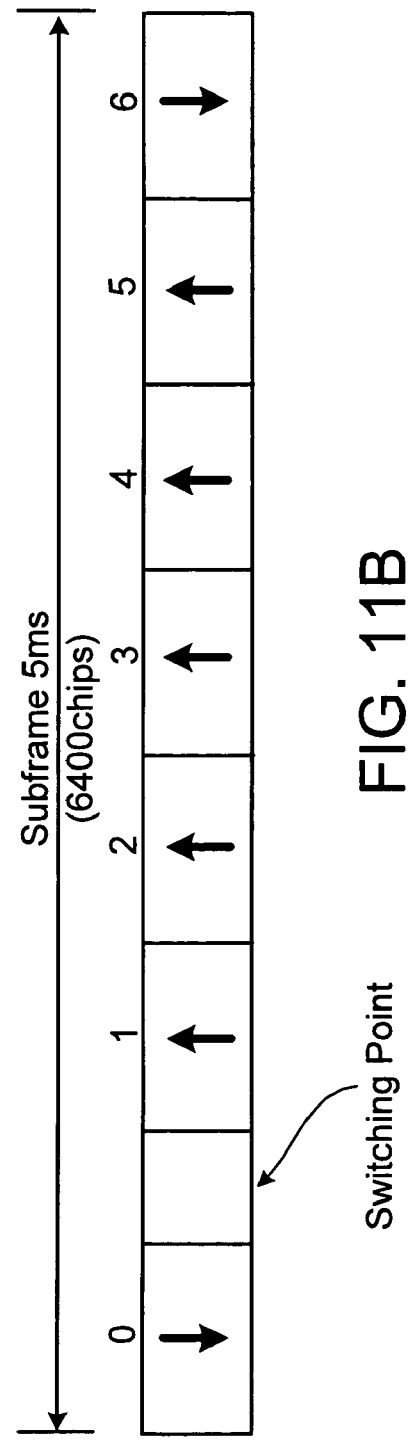

FIGS. 11A and 11B illustrate the TD-SCDMA frame structure. Each frame has a duration of 10 ms and is divided into 2 sub-frames of 5 ms, one sub-frame of which is illustrated in FIG. 11A. Both sub-frames in the TD-SCDMA frame are the same. Each sub-frame is divided into seven time slots labeled 0-6. Each time slot is either allocated for downlink (indicated by the down arrows) or uplink (indicated by the up arrows) transmissions. In some implementations, the first time slot (slot 0) is always allocated to downlink transmission and the second time slot (slot 1) is always allocated to uplink transmission. There is a switching point between the first and second time slots. For example, in FIG. 11A the time slots are evenly allocated between downlink and uplink transmissions. In FIG. 11B, the first and last time slots are allocated to downlink, and the remaining 5 time slots are allocated to uplink. The allocation illustrated FIG. 11B may be desirable when uplink transmissions require more bandwidth such as in an upload operation from the mobile device to the base station. The dynamic allocation of time slots facilitates flexibility in asymmetric transmissions.

Applicant has appreciated that by organizing the memory written to by the UL BRP 172 and read from by the UL CRP 166 to reflect the time slot structure of the TD-SCDMA frame, an efficient implementation may be provided.

Referring to FIG. 10, the frame memory 170 is divided into two frame buffers, e.g., frame buffer A 250 and frame buffer B 252. Each of the frame buffers 250 and 252 has segments (e.g., 254a and 254b) that correspond to the time slots of the TD-SCDMA frame. The frame buffer A includes segments (e.g., 254a, 254b, 254c, etc., collectively referenced as 254) for a first frame, and the frame buffer B includes segments (e.g., 256a, 256b, 256c, etc., collectively referenced as 256) for a second frame. Each frame is divided into two sub-frames (e.g., 258a and 258b) to mirror the TD-SCDMA frame structure. Each sub-frame is divided into five different segments TS1-TS5, for example, corresponding to the five time slots that can be dynamically allocated (the active time slots) for uplink.

In some implementations, the size of each of the frame buffer A 250 and frame buffer B 252 is 1760 bytes, and the frame buffer A is equally divided between the two sub-frames. Within a sub-frame the address (or location) of each time slot (and each physical channel in a time slot) is fixed, and the size of a segment allocated to each time slot is 176 bytes. By using fixed memory addresses for the time slots, it is more convenient to determine which memory segments to write data to or read data from for given time slots.

If the UL BRP 172 or the DSP software 232 is allocated a particular time slot, the hardware or software knows which memory segment to write the data to be transmitted during the corresponding time slot. Likewise, the UL CRP hardware 166 and the DSP software 232 know which memory segment to read to obtain data for transmission for a particular time slot. For example, if a wireless device uses the time slots TS1 and TS3, but not time slots TS2, TS4, and TS5 for uplink transmission, the UL BRP 172 and DSP software 232 writes data associated with time slots TS1 and TS3 to memory segments 254a and 254c, respectively, skipping memory segment 254b.

In FIG. 10, the frame memory 170 includes segments for at least two frames. Specifically, frame buffer A 250 stores data for a first frame and frame buffer B 252 stores data for a second frame. Storing data for two frames in the frame memory 170 is useful because during uplink processing, the UL BRP 172 and the UL CRP 166 can be writing and reading data simultaneously for different frames.

For example, when the UL BRP 172 is writing data into buffer A 250 for a first frame during a given time interval, the UL CRP 166 is reading data from buffer B 252 corresponding to a previous frame written by the UL BRP 172 during the previous time interval. On the next time interval, the UL BRP 172 will write data to frame buffer B 252 corresponding to a second frame and the UL CRP 166 will read from frame buffer A 250 to obtain the first frame. In this way, the UL BRP 172 and the UL CRP 166 may read and write simultaneously but to different frame buffers to avoid each reading and writing to the same locations in the frame memory 170. The A-B buffer mechanism prevents the UL BRP hardware 172 from over-writing the frame memory 170 before the UL CRP 166 has completed reading out the frame data.

In some implementations, the management of the A-B frame buffers is handled by the DSP software 232. The DSP software 232 may determine whether the output of the UL BRP 172 is written to buffer A 250 or buffer B 252. Similarly, the DSP software 232 decides whether the input of the UL CRP 166 is read from buffer A 250 or buffer B 252. In some implementations, the DSP software 232 may directly send the CRP input to the frame memory 170 in case of BRP bypass mode. When sending the CRP input data, the DSP software 232 chooses the destination address, e.g., buffer A or buffer B and the address offset of the frame memory depending upon the sub-frame number and slot number.

In some implementations, the UL BRP 172 and the UL CRP hardware 166 are configured to control which of the buffers A-B the corresponding components read and write from. The memory organization illustrated in FIG. 10 facilitates a relatively simple and efficient architecture that exploits the flexibility offered by the TD-SCDMA standard.

In some implementations, each of the memory segments TS1-TS5 is further divided into two or more physical channels, each channel being associated with a separate code (e.g., a pseudo-random (PN) code) for transmission. That is, time slots can be shared by data encoded with two different codes. This reflects the time division and code division aspects of the TD-SCDMA standard.

Figure 12A:
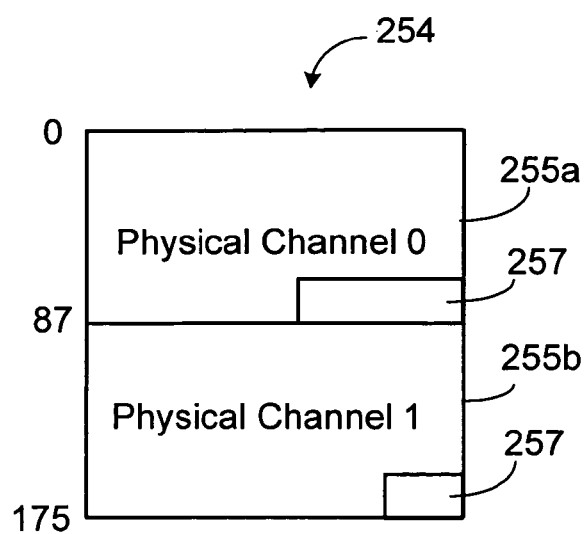
FIGS. 12A and 12B are diagrams of example segments of a frame memory.
Figure 12B:
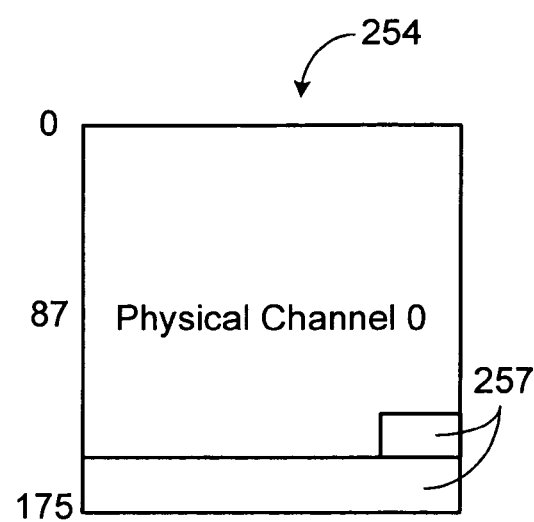

The organization of physical channel bits within a time slot is shown in FIGS. 12A and 12B. As shown in the figures, each time slot can be organized in two modes. FIG. 12A illustrates a memory segment 254 in which two physical channels are used. This memory organization is used for spreading factors of 2, 4, 8 or 16. The spreading factor is the ratio of chips to baseband information rate. When the spreading factors of physical channels are greater than 1, the memory available for the time slot is equally divided between the two physical channels. For example, the memory segment 254 is divided into two sections 255*a* and 255*b*, each section corresponding to one physical channel. Within a time slot, the address (or location) of each physical channel is fixed, and the size of a section allocated to each physical channel is 88 bytes. By using fixed memory addresses for the physical channels, it is more convenient to determine which section (e.g., 255*a* or 255*b*) to write data to or read data from for a given physical channel.

The memory sections 255*a* and 255*b* may store dummy bits 257 in which the number of dummy bits 257 may corresponds to the number of control channel bits and spreading factor. In some implementations, the dummy bits 257 are ignored by the CRP 166.

There are four possible cases (for all the four cases physical channel 0 (Ph#0) and physical channel 1 (Ph#1) start at fixed location as shown in FIG. 12A)

Both Ph#0 and PH#1 active
Only Ph#0 active (Ph#1 not active)
Only Ph#1 active (Ph#0 not active)
Both Ph#0 and PH#1 not active For example, physical channel 0 may be used to transmit first data during a corresponding time slot, the first data being stored in locations 0-87 of the memory segment. Physical channel 1 may be used to transmit second data during the given time slot, the second data being stored in locations 88-175 of the memory segment. The first data and second data are transmitted using different codes.

FIG. 12B illustrates a memory segment in which only a single physical channel is used. The memory available for the time slot is used by the single physical channel. If the spreading factor is 1, there will be only 1 physical channel (Ph#0) in the time slot. Dummy bits 257 are ignored by the CRP 166. For example, physical channel 0 may be used to transmit the data during the corresponding time slot, the data being stored in locations 0-175 of the memory segment.

It should be appreciated that the size of the data segment and how it is divided according to physical channels is exemplary and other organization may be used. In addition, while two physical channels are available in the memory segments illustrated in FIGS. 12A and 12B, any number of physical channels may be used.

The DSP software 232 can selectively fill data on a physical channel basis or time slot basis. This allows the capability to fill data in the frame memory 170 in any desired order. For example, in the case of multiple CCTrCH, the DSP software 232 can provide CRP data for the first CCTrCH while the BRP hardware provides CRP data for the second CCTrCH.

CRP Architecture and Program Flow

The following describes a CRP architecture that enables a flexible and convenient way to control program flow. As discussed above in connection with FIG. 1, the DSP core 122 may operate as a master of the co-processor 100, and may control the operation of the UL coprocessor 100 to facilitate uplink transmission from the mobile device to the base station. Applicant has appreciated benefits of providing DSP core programmers flexibility with respect to controlling when and in what order data is transmitted from the UL co-processor 100, and developed a flexible and efficient architecture to facilitate DSP core programmers in controlling the UL co-processor 100. In particular, it may be relatively difficult to describe to a software programmer how to program the UL coprocessor 100, particularly with respect to processing the data stored in the frame memory 170. Applicant has developed an architecture that presents a simplified view to the software programmer, facilitating a robust and flexible programming platform.

Figure 13:
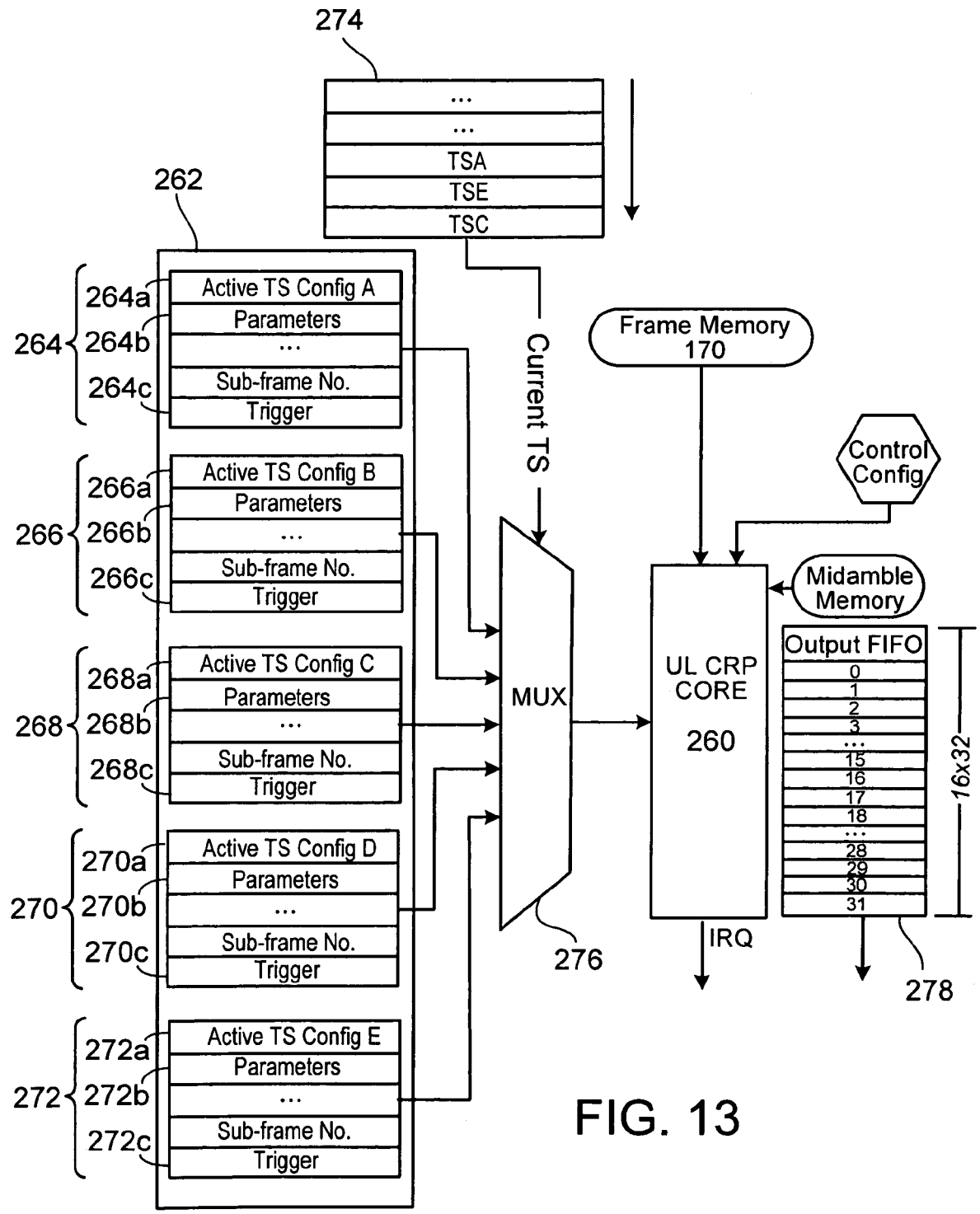
FIG. 13 illustrates an example chip rate processor that uses time slot configuration files.

FIG. 13 illustrates an UL CRP core 260 (which is part of the UL CRP 166) and various configuration components to facilitate a flexible interface that allows the DSP software 232 to control the UL CRP core 260 in a flexible and efficient manner. As discussed above, the UL CRP 166 is responsible, inter alia, for reading frames written by the UL BRP 172 and further processing the frames to be transmitted by the digital base band processor 120. In some implementations, each sub-frame of a TD-SCDMA frame has at most five active time-slots for uplink. Configuration registers 262 store information about how the UL CRP core 260 is to be configured when processing data for each of the uplink time slots.

A group of registers can be provided to store time slot configuration parameters for each of the active time slots. In this implementation, because there are at most five active time slots for uplink, 5 groups of registers are used to store 5 groups of time slot configuration parameters. The 5 groups of registers are referred to as TS configuration set A 264, TS configuration set B 266, TS configuration set C 268, TS configuration set D 270, and TS configuration set E 272. Each group of registers includes the configuration information for the associated time slot. In particular, each TS configuration set stores a list of parameters describing how the data for the corresponding time slot should be handled. The list of parameters for CRP may include, for example, spreading factor, scrambling code, power control information and power scaling factors for each of the physical channels. Each configuration set may include all the information necessary for the UL CRP 166 to process the corresponding time slot. In addition, each TS configuration set includes a trigger field (e.g., 264*c*), as discussed in further detail below.

The configuration information informs the UL CRP 166 how to handle the data to be transmitted in the corresponding time slot. For example, the parameters stored in each TS configuration configure the algorithm used by the CRP 166 for processing the data stored in the associated sub-frame. To simplify the software view of the UL CRP 166, Applicant has developed a queue trigger solution to provide a flexible mechanism to program how the time slots are to be ordered (e.g., in what order the time slots should be processed by the UL CRP) and which parameters are to be applied to each time slot.

The order in which the time-slots are processed is controlled by a trigger FIFO 274, which may be implemented as a standard first in first out queue that determines which TS configuration set is used for processing data in a particular time slot. For example, the trigger FIFO 274 is illustrated as storing TS Config A in the first out position, followed by TS Config E and TS Config C, meaning that the TS configuration set A will be used to process a time slot, following by using the TS configuration set E to process a time slot, followed by using the TS configuration set C to process a time slot, etc. Which time slot (i.e., TS0, TS1 . . . or TS6) should be processed at a given time can be determined by the DSP software.

The number of active time slots used by a wireless device may vary from one device to another, and may also vary depending on the software running on the wireless device. For example, a mobile phone may use time slots TS1 and TS5 for uplink. Thus, in the example shown in FIG. 13, the TS configuration sets A and E can be used for the current frame (to configure the CRP in processing TS1 and TS5, respectively) and the TS configuration set C can be used for the subsequent frame (to configure the CRP in processing TS2 of the subsequent frame). The TS configuration set number stored in the trigger FIFO 274 is provided to a multiplexer 276, which selects which TS configuration set to provide to the CRP core 260 for processing.

As further illustrations, in some examples, a wireless device may allocate 5 active time slots TS1, TS2, TS3, TS5, and TS6 for uplink. TS configuration sets A, B, C, D, and E can be used to configure the UL CRP core 260 in processing data associated with the time slots TS1, TS2, TS3, TS5, and TS6, respectively. In some examples, a wireless device may allocate 5 active time slots TS1, TS2, TS3, TS4, and TS5 for uplink. TS configuration sets A, B, C, D, and E can be used to configure the UL CRP core 260 in processing data associated with the time slots TS1, TS2, TS3, TS4, and TS5, respectively. In some examples, a wireless device may allocate 3 active time slots TS4, TS5, and TS6 for uplink. Three of the TS configuration sets A, B, C, D, and E can be used to configure the UL CRP core 260 in processing data associated with the time slots TS4, TS5, and TS6, respectively.

For each active time slot, the UL CRP core 260 receives data from the frame memory 170 through multiplexers (e.g., 242 and 244 shown in FIG. 10) and transforms the data according to the parameters stored in the selected TS configuration set. Time slot configuration set numbers are written into the trigger FIFO 274 in the order in which the associated trigger register (e.g., 264*c*) in the TS configuration set is activated (e.g., set to high or some other pre-defined trigger value). Once the trigger register is activated, the associated TS configuration set number (e.g., TSA, TSE, or TSC) is written into the trigger FIFO and processed accordingly. Thus, the order of triggering becomes the order of processing data in the associated time slots and the trigger FIFO 274 controls which of the active configuration sets are controlling the UL CRP 260 at any given time.

The output of the UL CRP 260 may be transferred to an internal memory 278 of the UL coprocessor 100 before being transferred to the DSP core 122. The internal memory 278 may be a 32 word deep output FIFO 278. Once the output FIFO 278 contains a burstable number (e.g., 4 words) of 16-bit words, the direct memory access controller 125 (see FIG. 1) may be notified, which initiates data transfer to the DSP memory. This process may be accomplished in other suitable ways.

Accordingly, the configuration registers 262 and the trigger FIFO 274 allow a software developer to define generally optimized configurations at any time and then select which configuration will correspond to each time slot by activating the associated trigger in the desired order. One advantage of the architecture in FIG. 13 is that there is no hard-coded relationship between the configuration and the actual physical time slot, allowing the software to dynamically determine which parameters to apply to which time slots. For example, the first TS configuration set A 264 is not necessarily used to configure the CRP 260 to process data for the first of the five active time slots (e.g., TS1 in FIG. 10), but can be used to configure the CRP 260 to process any of the five active time slots (e.g., TS1 to TS5 in FIG. 10).

In some implementations, a constraint may be placed on the order in which TS configuration sets are used for various time slots. In some examples, TS configuration sets A to E are selectively used in sequence to process time slots within a frame. Thus, in a mobile phone that transmits data in two time slots TS2 and TS3, TS configuration set A can be used for TS2 and set B can be used for TS3, or set B can be used for TS2 and set C can be used for TS3 (set A is not used). In this example, the phone may not support using TS configuration set B for TS2 and set A for TS3.

It should be appreciated that the TS configuration sets can be written all at once and then triggered in different orders, or some subset of the TS configuration sets can be written and triggered multiple times. By allowing the software to write configuration sets whenever they are available, the software can write all five active configurations at once if available to reduce interaction between the CRP hardware 166 and the DSP software 232. However, to remain flexible for circumstances where the parameters may not be available, the configuration sets can be written one by one and then triggered in a desired order.

The chip architecture shown in FIG. 1 can be used in a wireless device, such as a mobile station (e.g., smart phone or PDA), that complies with the TD-SCDMA standard and/or Wideband CDMA standard.

Figure 14:
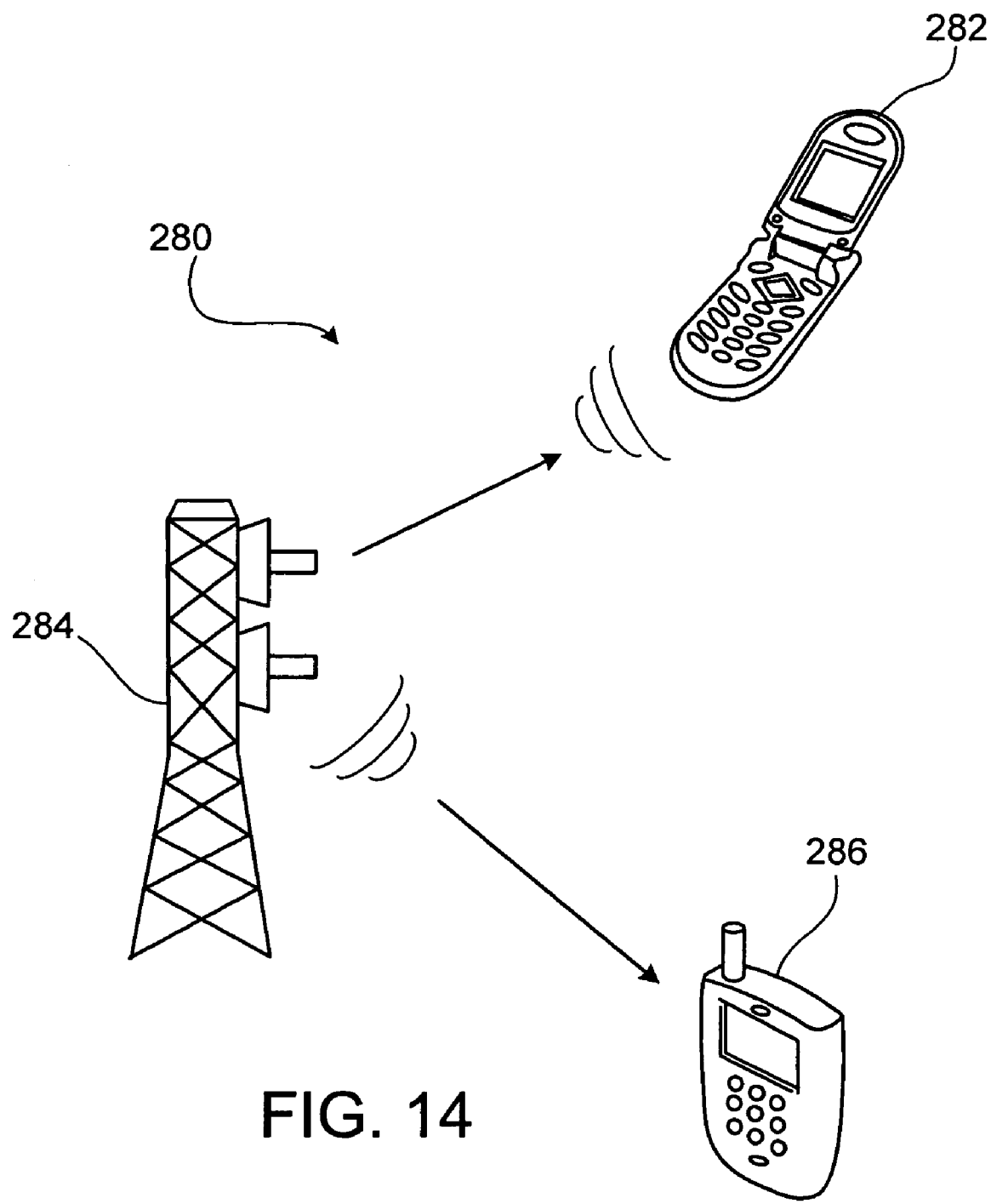
FIG. 14 is a diagram of an example wireless communication system.

FIG. 14 is a diagram of an example wireless network 280, in which a wireless device or mobile station 282 (also referred to as user equipment in some telecommunication standards) includes the digital base band processor 120 and accelerator 110 of FIG. 1, and a transmitter for enabling uplink transmissions to a cellular network represented by a cellular tower 284. The digital base band processor 120 and accelerator 110 may be fabricated as part of an integrated circuit, such as a wireless chipset, and mounted on a circuit board in the mobile station 282. The cellular network may connect the mobile station 282 to other devices, such as other mobile stations 286.

It should be appreciated that various aspects of the present invention may be may be used alone, in combination, or in a variety of arrangements not specifically discussed in the implementations described in the foregoing and is therefore not limited in its application to the details and arrangement of components set forth in the foregoing description or illustrated in the drawings.

Although some examples have been discussed above, other implementations and applications are also within the scope of the following claims. Various aspects of the invention described herein may be implemented in any of numerous ways. For example, the various components described above may be implemented in hardware, firmware, software or any combination thereof. The TTI memory structure shown in FIG. 6 is not limited to being used in an uplink chain, and can be used for other purposes. Sharing a dual-port memory among multiple masters without using an arbiter to arbitrate access to the dual-port memory, as shown in FIG. 9, can be used in other systems. The time slot configuration sets and trigger FIFO, as shown in FIG. 13, can be used to provide flexibility in configuring various types of controllers and data processors. In the example of FIG. 9, the transmit frame memory 680 can be replaced by another memory that is accessed by multiple masters, and the BRP hardware 172, CRP hardware 166, and DSP software 232 can be replaced by other types of masters.

What is claimed is:

1. An apparatus comprising:
   a dual-port frame memory having a first access port and a second access port in which data can be written to the dual-port frame memory through the first access port at the same time that data is read from the dual-port frame memory through the second access port;
   a bit rate processor to perform bit rate processing on input data and to write data resulting from the bit rate processing to the dual-port frame memory through the first access port, in which the bit rate processor does not read data from the dual-port frame memory through the second access port;
   a chip rate processor to read data from the dual-port frame memory through the second access port and perform chip rate processing on the data read from the dual-port frame memory, in which the chip rate processor does not write data to the dual-port frame memory through the first access port; and
   a data processor to execute a software application that writes data to the dual-port frame memory through the first access port and reads data from the dual-port frame memory through the second access port.

2. The apparatus of claim 1 in which the bit rate processor performs at least one of channel encoding, interleaving, rate matching, and physical channel mapping on the input data.

3. The apparatus of claim 1 in which the chip rate processor performs at least one of spreading data, scrambling data, and combining data from multiple physical channels to prepare data for uplink transmission.

4. The apparatus of claim 1, further comprising a first multiplexer to multiplex write requests from the bit rate processor and the software application, and a second multiplexer to multiplex read requests from the chip rate processor and the software application.

5. The apparatus of claim 4 in which the bit rate processor and the chip rate processor have higher priority than the software application such that the first multiplexer allows the software application to write to the dual-port frame memory only when the bit rate processor is not writing to the dual-port frame memory and allows the software application to read from the dual-port frame memory only when the chip rate processor is not reading from the dual-port frame memory.

6. The apparatus of claim 1 in which the software application has information on operations of the bit rate processor and is configured to write to the dual-port frame memory during time periods in which the bit rate processor is not writing to the dual-port frame memory.

7. The apparatus of claim 1 in which the software application has information on operations of the chip rate processor and is configured to read from the dual-port frame memory during time periods in which the chip rate processor is not reading from the dual-port frame memory.

8. The apparatus of claim 1 in which the bit rate processor and the chip rate processor process data according to at least one of Code Division Multiple Access standard, Wideband Code Division Multiple Access standard, and Time Division-Synchronous Code Division Multiple Access standard.

9. The apparatus of claim 1 in which the dual-port frame memory includes a first buffer to store a first frame of data and a second buffer to store a second frame of data.

10. The apparatus of claim 9 in which at some time periods the bit rate processor writes to the first buffer and the chip rate processor reads from the second buffer, and at other time periods the bit rate processor writes to the second buffer and the chip rate processor reads from the first buffer.

11. The apparatus of claim 9 in which the first buffer includes a first portion for storing data associated with a first sub-frame and a second portion for storing data associated with a second sub-frame, the first portion including five segments each for storing data associated with one of five active time slots of the first sub frame, the second portion including five segments each for storing data associated with one of five active time slots of the second subframe.

12. The apparatus of claim 1 in which the frame memory is divided into segments each associated with a time slot, and each segment stores data associated with at least two physical channels when a spreading factor is greater than 1.

13. The apparatus of claim 12 in which each segment stores data associated with a single physical channel when the spreading factor is equal to 1 or when there is only one physical channel in a time slot.

14. The apparatus of claim 1 in which the software application also performs bit rate processing on input data and write data resulting from the bit rate processing to the dual-port frame memory through the first access port.

15. The apparatus of claim 14 in which the bit rate processor performs bit rate processing for the first channel, and the software application performs bit rate processing for the second channel.

16. The apparatus of claim 15 in which the first and second channels comprise a transport channel and a control channel.

17. The apparatus of claim 14 in which a first channel and a second channel are associated with a time slot, and the bit rate processor and the data processor are operable in three modes in which in the first mode, the software application performs bit rate processing for the first and second channels, in the second mode, the bit rate processor performs bit rate processing for the first and second channels, and in the third mode, the bit rate processor performs bit rate processing for the first channel and the software application performs bit rate processing for the second channel.

18. The apparatus of claim 14 in which the bit rate processor performs bit rate processing using a fixed algorithm and the software application performs bit rate processing using an algorithm specified by software code that can be updated.

19. The apparatus of claim 1 in which the software application also performs chip rate processing on data read from the dual-port frame memory through the second access port.

20. The apparatus of claim 19 in which the chip rate processor performs chip rate processing for a first time slot and the software application performs chip rate processing for a second time slot.

21. The apparatus of claim 19 in which the chip rate processor performs chip rate processing using a fixed algorithm and the software application performs chip rate processing using an algorithm specified by software code that can be updated.

22. A method comprising:
performing bit rate processing using a bit rate processor and writing data resulting from the bit rate processing to a dual-port frame memory through a first access port of the dual-port frame memory, the dual-port frame memory allowing data to be written to the dual-port frame memory through the first access port at the same time that data is read from the dual-port frame memory through a second access port of the dual-port frame memory, in which the bit rate processor does not read data from the dual-port frame memory through the second access port;
reading data from the dual-port frame memory through the second access port and performing chip rate processing on the data read from the dual-port frame memory using a chip rate processor, in which the chip rate processor does not write data to the dual-port frame memory through the first access port; and
executing software application on a data processor in which the software application writes data to the dual-port frame memory through the first access port and reads data from the dual-port frame memory through the second access port.

23. The method of claim 22 in which performing the bit rate processing comprises performing at least one of channel encoding, interleaving, rate matching, and physical channel mapping on input data.

24. The method of claim 22 in which performing the chip rate processing comprises performing at least one of spreading data, scrambling data, and combining data from multiple physical channels to prepare data for uplink transmission.

25. The method of claim 22, further comprising multiplexing write requests from the bit rate processor and the software application, and multiplexing read requests from the chip rate processor and the software application.

26. The method of claim 25, further comprising giving the bit rate processor a higher priority than the software application and preventing the software application from writing to the dual-port frame memory when the bit rate processor is writing to the dual-port frame memory.

27. The method of claim 25, further comprising giving the chip rate processor a higher priority than the software application and preventing the software application from reading from the dual-port frame memory when the chip rate processor is reading from the dual-port frame memory.

28. The method of claim 22, further comprising using the software application to control operation of the bit rate processor and using the software application to write to the dual-port frame memory when the bit rate processor is not writing to the dual-port frame memory.

29. The method of claim 22, further comprising using the software application to control operation of the chip rate processor and using the software application to read from the dual-port frame memory when the chip rate processor is not reading from the dual-port frame memory.

30. The method of claim 22 in which performing the bit rate processing and the chip rate processing comprises processing data according to at least one of Code Division Multiple Access standard, Wideband Code Division Multiple Access standard, and Time Division-Synchronous Code Division Multiple Access standard.

31. The method of claim 22, comprising writing a first frame of data into a first segment of the dual-port frame memory and a second frame of data into a second segment of the dual-port frame memory.

32. The method of claim 31, comprising using the bit rate processor to write data into the first segment and using the chip rate processor to read data from the second segment during a first time period, and using the bit rate processor to write data into the second segment and using the chip rate processor to read data from the first segment during a second time period.

33. The method of claim 22, comprising using the software application to perform bit rate processing on input data and write data resulting from the bit rate processing to the dual-port frame memory through the first access port.

34. The method of claim 33, comprising using the bit rate processor to perform bit rate processing on data associated with a first channel and using the software application to perform bit rate processing on data associated with a second channel.

35. The method of claim 33, comprising using the bit rate processor to perform bit rate processing using a fixed algorithm and using the software application to perform bit rate processing using an algorithm specified by software code that can be updated.

36. The method of claim 22, comprising using the software application to read data from the dual-port frame memory through the second access port and perform chip rate processing on the data read from the dual-port frame memory.

37. The method of claim 36, comprising using the chip rate processor to perform chip rate processing on data associated with a first time slot and using the software application to perform chip rate processing on data associated with a second time slot.

38. The method of claim 36, comprising using the chip rate processor to perform chip rate processing using a fixed algorithm and using the software application to perform chip rate processing using an algorithm specified by software code that can be updated.

39. A wireless device comprising:
a dual-port frame memory having a first access port and a second access port in which data can be written to the dual-port frame memory through the first access port at the same time that data is read from the dual-port frame memory through the second access port;
a bit rate processor to perform bit rate processing on input data and to write data resulting from the bit rate processing to the dual-port frame memory through the first access port, the bit rate processing comprising at least one of channel encoding, interleaving, rate matching, and physical channel mapping on the input data, in which the bit rate processor does not read data from the dual-port frame memory through the second access port;
a chip rate processor to read data from the dual-port frame memory through the second access port and perform chip rate processing on the data read from the dual-port frame memory, the chip rate processing comprising at least one of spreading data, scrambling data, and combining data from multiple physical channels to prepare data for uplink transmission, in which the chip rate processor does not write data to the dual-port frame memory through the first access port;

a transmitter to wirelessly transmit a signal derived from the data resulting from the chip rate processing; and a general purpose digital signal processor to execute a software application to control operation of the bit rate processor and the chip rate processor, the software application configured to write data to the dual-port frame memory through the first access port and read data from the dual-port frame memory through the second access port.

40. An apparatus comprising:

a dual-port frame memory having a first access port and a second access port in which data can be written to the dual-port frame memory through the first access port at the same time that data is read from the dual-port frame memory through the second access port;

means for performing bit rate processing and writing data resulting from the bit rate processing to the dual-port frame memory through the first access port without reading data from the dual-port frame memory through the second access port;

means for reading data from the dual-port frame memory through the second access port and performing chip rate processing on the data read from the dual-port frame memory without writing data to the dual-port frame memory through the first access port; and a data processor to execute a software application that writes data to the dual-port frame memory through the first access port and reads data from the dual-port frame memory through the second access port.

41. An apparatus comprising:

a dual-port frame memory having a first access port and a second access port in which data can be written to the dual-port frame memory through the first access port at the same time that data is read from the dual-port frame memory through the second access port;

a bit rate processor to perform bit rate processing on input data and to write data resulting from the bit rate processing to the dual-port frame memory through the first access port;

a chip rate processor to read data from the dual-port frame memory through the second access port and perform chip rate processing on the data read from the dual-port frame memory;

a data processor to execute a software application that writes data to the dual-port frame memory through the first access port and reads data from the dual-port frame memory through the second access port;

a first multiplexer to multiplex write requests from the bit rate processor and the software application; and a second multiplexer to multiplex read requests from the chip rate processor and the software application;

wherein the bit rate processor and the chip rate processor have higher priority than the software application such that the first multiplexer allows the software application to write to the dual-port frame memory only when the bit rate processor is not writing to the dual-port frame memory and allows the software application to read from the dual-port frame memory only when the chip rate processor is not reading from the dual-port frame memory.

42. An apparatus comprising:

a dual-port frame memory having a first access port and a second access port in which data can be written to the dual-port frame memory through the first access port at the same time that data is read from the dual-port frame memory through the second access port, the dual-port frame memory including a first buffer to store a first frame of data and a second buffer to store a second frame of data, the first buffer including a first portion for storing data associated with a first sub-frame and a second portion for storing data associated with a second sub-frame, the first portion including five segments each for storing data associated with one of five active time slots of the first sub frame, the second portion including five segments each for storing data associated with one of five active time slots of the second subframe;

a bit rate processor to perform bit rate processing on input data and to write data resulting from the bit rate processing to the dual-port frame memory through the first access port;

a chip rate processor to read data from the dual-port frame memory through the second access port and perform chip rate processing on the data read from the dual-port frame memory; and a data processor to execute a software application that writes data to the dual-port frame memory through the first access port and reads data from the dual-port frame memory through the second access port.

43. An apparatus comprising:

a dual-port frame memory having a first access port and a second access port in which data can be written to the dual-port frame memory through the first access port at the same time that data is read from the dual-port frame memory through the second access port, the frame memory being divided into segments each associated with a time slot, and each segment stores data associated with at least two physical channels when a spreading factor is greater than 1;

a bit rate processor to perform bit rate processing on input data and to write data resulting from the bit rate processing to the dual-port frame memory through the first access port;

a chip rate processor to read data from the dual-port frame memory through the second access port and perform chip rate processing on the data read from the dual-port frame memory; and a data processor to execute a software application that writes data to the dual-port frame memory through the first access port and reads data from the dual-port frame memory through the second access port.

44. The apparatus of claim 43 in which each segment of the frame memory stores data associated with a single physical channel when the spreading factor is equal to 1 or when there is only one physical channel in a time slot.

45. An apparatus comprising:

a dual-port frame memory having a first access port and a second access port in which data can be written to the dual-port frame memory through the first access port at the same time that data is read from the dual-port frame memory through the second access port;

a bit rate processor to perform bit rate processing on input data and to write data resulting from the bit rate processing to the dual-port frame memory through the first access port;

a chip rate processor to read data from the dual-port frame memory through the second access port and perform chip rate processing on the data read from the dual-port frame memory; and a data processor to execute a software application that writes data to the dual-port frame memory through the first access port and reads data from the dual-port frame memory through the second access port, the software application also performing bit rate processing on input data and write data resulting from the bit rate processing to the dual-port frame memory through the first access port;

wherein a first channel and a second channel are associated with a time slot, and the bit rate processor and the data processor are operable in three modes in which in the first mode, the software application performs bit rate processing for the first and second channels, in the second mode, the bit rate processor performs bit rate processing for the first and second channels, and in the third mode, the bit rate processor performs bit rate processing for the first channel and the software application performs bit rate processing for the second channel.

46. A method comprising:

performing bit rate processing using a bit rate processor and writing data resulting from the bit rate processing to a dual-port frame memory through a first access port of the dual-port frame memory, the dual-port frame memory allowing data to be written to the dual-port frame memory through the first access port at the same time that data is read from the dual-port frame memory through a second access port of the dual-port frame memory;

reading data from the dual-port frame memory through the second access port and performing chip rate processing on the data read from the dual-port frame memory using a chip rate processor;

executing software application on a data processor in which the software application writes data to the dual-port frame memory through the first access port and reads data from the dual-port frame memory through the second access port;

multiplexing write requests from the bit rate processor and the software application, and multiplexing read requests from the chip rate processor and the software application; and giving the bit rate processor a higher priority than the software application and preventing the software application from writing to the dual-port frame memory when the bit rate processor is writing to the dual-port frame memory.

47. A method comprising:

performing bit rate processing using a bit rate processor and writing data resulting from the bit rate processing to a dual-port frame memory through a first access port of the dual-port frame memory, the dual-port frame memory allowing data to be written to the dual-port frame memory through the first access port at the same time that data is read from the dual-port frame memory through a second access port of the dual-port frame memory;

reading data from the dual-port frame memory through the second access port and performing chip rate processing on the data read from the dual-port frame memory using a chip rate processor;

executing software application on a data processor in which the software application writes data to the dual-port frame memory through the first access port and reads data from the dual-port frame memory through the second access port;

writing a first frame of data into a first segment of the dual-port frame memory and a second frame of data into a second segment of the dual-port frame memory; and using the bit rate processor to write data into the first segment and using the chip rate processor to read data from the second segment during a first time period, and using the bit rate processor to write data into the second segment and using the chip rate processor to read data from the first segment during a second time period.

48. An apparatus comprising:

a dual-port frame memory having a first access port and a second access port in which data can be written to the dual-port frame memory through the first access port at the same time that data is read from the dual-port frame memory through the second access port;

a first processor to process data and write data resulting from the processing to the dual-port frame memory through the first access port, in which the first processor does not read data from the dual-port frame memory through the second access port;

a second processor to read data from the dual-port frame memory through the second access port and process the data read from the dual-port frame memory, in which the second processor does not write data to the dual-port frame memory through the first access port;

a third processor to execute a software application that writes data to the dual-port frame memory through the first access port and reads data from the dual-port frame memory through the second access port;

a first multiplexer to multiplex write requests from the bit rate processor and the software application; and a second multiplexer to multiplex read requests from the chip rate processor and the software application;

wherein no arbiter is used to arbitrate access to the dual-port frame memory by the first, second, and third processors, the bit rate processor and the chip rate processor having higher priority than the software application such that the first multiplexer allows the software application to write to the dual-port frame memory only when the first processor is not writing to the dual-port frame memory and allows the software application to read from the dual-port frame memory only when the second processor is not reading from the dual-port frame memory.

49. An apparatus comprising:

a dual-port frame memory having a first access port and a second access port in which data can be written to the dual-port frame memory through the first access port at the same time that data is read from the dual-port frame memory through the second access port;

a first processor to process data and write data resulting from the processing to the dual-port frame memory through the first access port, in which the first processor does not read data from the dual-port frame memory through the second access port;

a second processor to read data from the dual-port frame memory through the second access port and process the data read from the dual-port frame memory, in which the second processor does not write data to the dual-port frame memory through the first access port; and a third processor to execute a software application that writes data to the dual-port frame memory through the first access port and reads data from the dual-port frame memory through the second access port;

wherein no arbiter is used to arbitrate access to the dual-port frame memory by the first, second, and third processors, the software application has information on operations of the first processor and is configured to write to the dual-port frame memory during time periods in which the first processor is not writing to the dual-port frame memory, and the software application has information on operations of the second processor and is configured to read from the dual-port frame memory during time periods in which the second processor is not reading from the dual-port frame memory.

* * * * *